(12) United States Patent
Nakajima

(10) Patent No.: US 6,947,312 B2
(45) Date of Patent: Sep. 20, 2005

(54) MRAM HAVING SAL LAYER

(75) Inventor: Kentaro Nakajima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 165 days.

(21) Appl. No.: 10/606,733

(22) Filed: Jun. 27, 2003

(65) Prior Publication Data
US 2004/0165453 A1 Aug. 26, 2004

(30) Foreign Application Priority Data
Feb. 26, 2003 (JP) ........................................ 2003-049610

(51) Int. Cl.$^7$ ................................................ G11C 7/00
(52) U.S. Cl. ............................................ 365/158; 365/171
(58) Field of Search .............................. 365/158, 171, 365/173, 97; 324/252

(56) References Cited

U.S. PATENT DOCUMENTS

| | | |
|---|---|---|
| 5,940,319 A | 8/1999 | Durlam et al. |
| 5,956,267 A | 9/1999 | Hurst et al. |
| 6,707,083 B1 * | 3/2004 | Hiner et al. ................ 257/295 |
| 6,781,872 B2 * | 8/2004 | Saito et al. ................ 365/158 |
| 6,828,785 B2 * | 12/2004 | Hosomi et al. ............. 324/252 |
| 6,829,161 B2 * | 12/2004 | Huai et al. ................. 365/158 |
| 2004/0100832 A1 | 5/2004 | Nakajima |

FOREIGN PATENT DOCUMENTS

| | | |
|---|---|---|
| JP | 8-306014 | 11/1996 |
| WO | WO 00/10172 | 2/2000 |

* cited by examiner

Primary Examiner—Vu A. Le
(74) Attorney, Agent, or Firm—Oblon, Spivak, McClelland, Maier & Neustadt, P.C.

(57) ABSTRACT

A second conductive layer is formed above a first conductive layer and arranged substantially perpendicular to the first conductive layer. A plurality of magneto-resistance effect elements are formed between the first and second conductive layers and arranged in the lengthwise direction of the first conductive layer and contain free layers whose spin directions are controlled to be reversed by a resultant magnetic field caused by the first and second conductive layers. A magnetic layer is inserted between the first conductive layer and the magneto-resistance effect elements and causes magnetic interaction with respect to the free layers of the magneto-resistance effect elements.

26 Claims, 12 Drawing Sheets

MRAM HAVING SAL LAYER

CROSS-REFERENCE TO RELATED APPLICATIONS

This application is based upon and claims the benefit of priority from the prior Japanese Patent Application No. 2003-049610, filed Feb. 26, 2003, the entire contents of which are incorporated herein by reference.

BACKGROUND OF THE INVENTION

1. Field of the Invention

This invention relates to a magnetic memory device such as an MRAM, for example.

2. Description of the Related Art

As the conventional magnetic random access memory (which is hereinafter simply referred to as an MRAM), an example (U.S. Pat. No. 5,940,319, U.S. Pat. No. 5,956,267, European Patent Application Publication No. WO 00/10, 172, Jpn. Pat. Appln. KOKAI Publication No. 8-306014) in which a yoke structure or a keeper layer formed of a magnetic material with high magnetic permeability is provided on the peripheral portion of a programming wiring of a memory cell is proposed.

The MRAM is a general term for solid memory devices in which storage information can be rewritten, held and read out as required by using the magnetization direction of a ferromagnetic body as a storage information carrier.

The MRAM memory cell generally has a structure having a plurality of ferromagnetic bodies laminated. Storage of information is performed based on binary information items "0", "1" indicating that the relative magnetization (spin) directions of a plurality of ferromagnetic bodies configuring the memory cell are parallel or bilinear. Programming of storage information is performed by reversing the magnetization direction of the ferromagnetic body of each cell according to the current magnetic field caused by passing a current through programming lines arranged in a cross-stripe form. The power consumption of the MRAM at the storage information holding time is zero in principle and the MRAM memory cell is a nonvolatile memory device which can hold storage information even after the power supply is turned OFF. Reading-out of storage information is performed based on a phenomenon that the electrical resistance of the memory cell varies depending on the relative angle between the sense current and the magnetization direction of ferromagnetic body configuring the cell or the relative angle between the magnetization directions of a plurality of ferromagnetic layers, that is, on a so-called magneto-resistance effect.

It is understood that the MRAM has the following advantages by comparing the function of the MRAM with the function of the conventional semiconductor memory device using a dielectric substance. That is, the MRAM is a perfect nonvolatile memory and has various advantages that it can perform the rewriting operation by $10^{15}$ times or more, the readout cycle can be shortened since the nondestructive readout operation can be performed and the refresh operation is not necessary, and it is highly resistant to radiation in comparison with a charge coupled memory cell, for example. It is predicted that the integration density per unit area, programming time and readout time of the MRAM are approximately equal to those of a DRAM. Therefore, it is expected that MRAMs may be applied to external memory devices of mobile device, LSI hybrid devices and main memory devices of personal computers by utilizing the significant feature of non-volatility.

In the MRAM which is studied to be put into practice, an MTJ element exhibiting the ferromagnetic tunnel effect is used for the memory cell. The MTJ element is configured by a three-layered film which is mainly formed of a ferromagnetic body/insulating layer/ferromagnetic body and a current tunnels and flows through the insulating film. The tunnel resistance varies in proportion to the cosine of the relative angle between the magnetization directions of the two ferromagnetic metal layers and is set to a maximum value when the magnetization directions of the two ferromagnetic metal layers are bilinear. The state is set as "0". On the other hand, when the magnetization directions of the two ferromagnetic metal layers are parallel, the tunnel resistance is set to a minimum value and the state is set as "1".

However, the wiring current cannot be reduced when the conventional MTJ element is used and there occurs a problem that interference between magnetic fields occurs at the programming time.

BRIEF SUMMARY OF THE INVENTION

According to an aspect of the present invention, there is provided a magnetic memory device comprising a first conductive layer; a second conductive layer formed above the first conductive layer and arranged substantially perpendicular to the first conductive layer; a plurality of magneto-resistance effect elements formed between the first and second conductive layers, arranged in the lengthwise direction of the first conductive layer and containing free layers whose spin directions are controlled to be reversed by a resultant magnetic field caused by the first and second conductive layers; and a magnetic layer inserted between the first conductive layer and the magneto-resistance effect elements, including a soft magnetic body, and causing magnetic interaction with respect to the free layers of the magneto-resistance effect elements.

According to another aspect of the present invention, there is provided a magnetic memory device comprising: a first conductive layer; a second conductive layer formed above the first conductive layer and arranged substantially perpendicular to the first conductive layer; and a plurality of magneto-resistance effect elements formed between the first and second conductive layers, arranged in the lengthwise direction of the first conductive layer and containing free layers whose spin directions are controlled to be reversed by a resultant magnetic field caused by the first and second conductive layers, where the first conductive layer is formed of a soft magnetic body which causes magnetic interaction with respect to the free layers of the magneto-resistance effect elements, and each of the magneto-resistance effect elements includes a tunnel barrier layer disposed on the free layer, a pin layer disposed on the tunnel barrier layer, and a fixing layer disposed on the pin layer and fixing the spin direction of the pin layer.

DETAILED DESCRIPTION OF THE INVENTION

There will now be described embodiments of this invention with reference to the accompanying drawings. In the explanation, common reference symbols are attached to like portions throughout the drawings.

[First Embodiment]

Figure 1A:
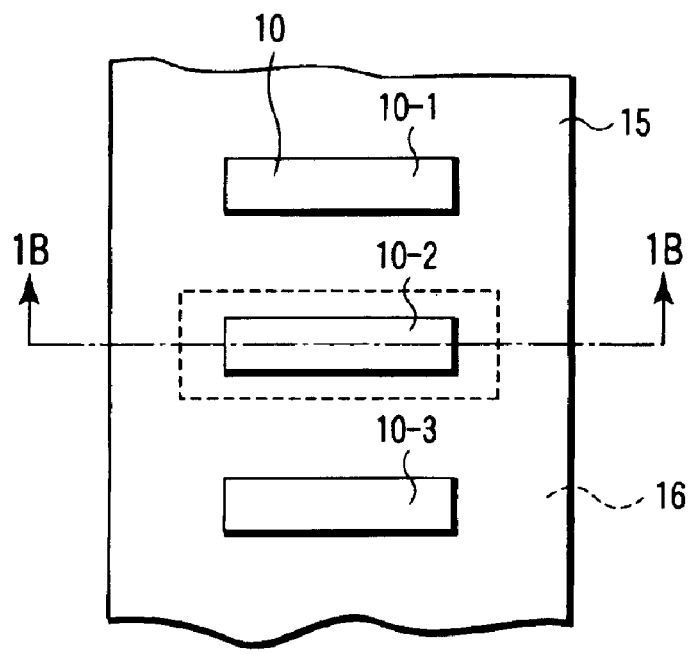
FIG. 1A is a plan view of a magnetic memory device according to a first embodiment of this invention.
Figure 1B:
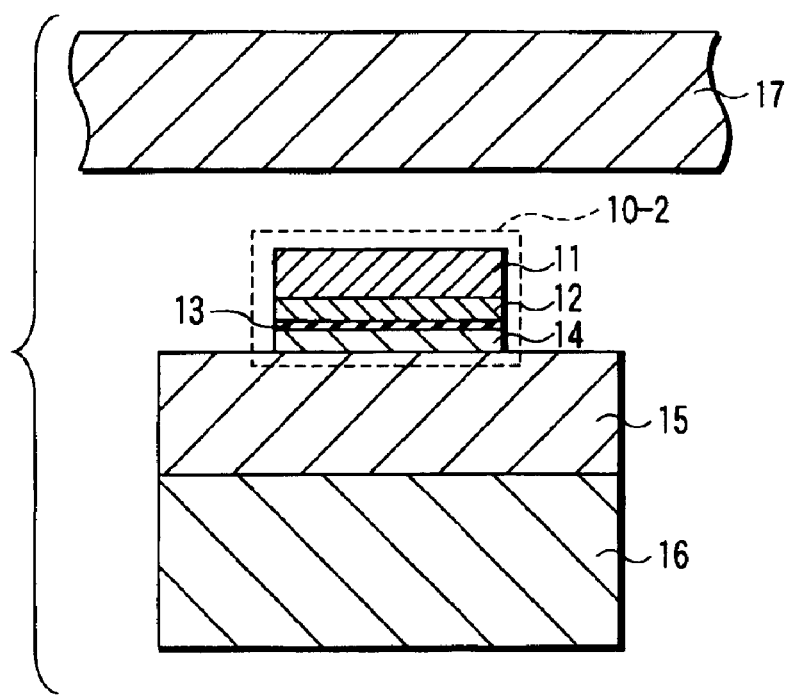
FIG. 1B is a cross sectional view of the magnetic memory device of the first embodiment taken along the 1B—1B line of FIG. 1A as viewed in a direction indicated by the arrows thereof.

FIG. 1A is a first plan view schematically showing a magnetic memory device according to a first embodiment of this invention. FIG. 1B is a first cross sectional view taken along the 1B—1B line of FIG. 1A as viewed in a direction indicated by the arrows thereof. The structure of this embodiment is explained in detail below with reference to FIGS. 1A and 1B.

FIG. 1A is the first plan view showing a plurality of MTJ elements 10-1 to 10-3 arranged along the lengthwise or longitudinal direction of a first programming wiring 16 and used as magneto-resistance effect elements and a SAL (Soft Adjacent Layer) layer 15 which is formed to overlap the first programming wiring 16 and causes magnetic interaction with respect to the MTJ elements 10-1 to 10-3. In this case, the SAL layer 15 is a ferromagnetic layer containing a soft magnetic body.

As shown in FIG. 1B, second programming wirings 17 which are arranged substantially perpendicular to the first programming wiring 16 are respectively disposed above the MTJ elements 10-1 to 10-3. However, the second programming wirings 17 are not shown in FIG. 1A.

As shown in FIG. 1A, the short-length or lateral directions of the MTJ elements 10-1 to 10-3, that is, the lengthwise directions of the first programming wiring 16 and SAL layer 15 are set in approximately the same direction.

Further, as described before, FIG. 1B is a first cross sectional view showing the MTJ element 10-2, SAL layer 15 and first programming wiring 16 taken along the 1B—1B line of FIG. 1A as viewed in a direction indicated by the arrows thereof. The structure of the memory device will be explained by taking the MTJ element 10-2 as an example.

The MTJ element 10-2 in FIGS. 1A and 1B has a structure in which an anti-ferromagnetic film 11, ferromagnetic pin layer 12, tunnel barrier layer 13 and ferromagnetic free layer 14 are laminated in this order from the top on the SAL layer 15. The anti-ferromagnetic film 11 is a fixed layer provided near the second programming wiring 17. The ferromagnetic pin layer 12 is disposed in contact with the anti-ferromagnetic film 11 and the spin direction thereof is fixed by the action of the anti-ferromagnetic film 11. The tunnel barrier layer 13 is disposed in contact with the pin layer 12. The ferromagnetic free layer 14 is disposed in contact with the tunnel barrier layer 13 and the spin direction thereof is controlled by a resultant magnetic field caused by the first programming wiring 16 and second programming wirings 17. The other MTJ elements 10-1, 10-3 have the same structure.

Even if the anti-ferromagnetic film 11 is configured as a multi-layered film containing at least a single-layered anti-ferromagnetic film instead of using the single-layered anti-ferromagnetic film, it is also possible to fix the spin direction of the pin layer 12.

As shown in FIG. 1B, if the SAL layer 15 is inserted between the MTJ element 10-2 and the first programming wiring 16, magnetic interaction is caused between the SAL layer 15 and the free layer 14 of the MTJ element 10-2. The magnetic interaction will be described in detail later.

Next, the programming and readout operations of the present embodiment are explained in detail with reference to FIGS. 2A, 2B, 3A and 3B.

Figure 2A:
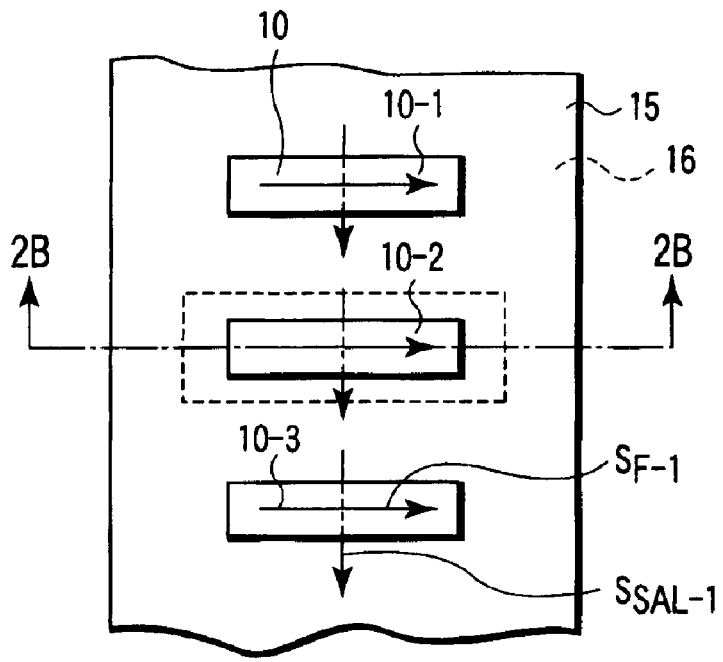
FIG. 2A is a plan view schematically showing the spin states of free layers and SAL layer before passing a current through a first programming wiring in the magnetic memory device according to the first embodiment.
Figure 2B:
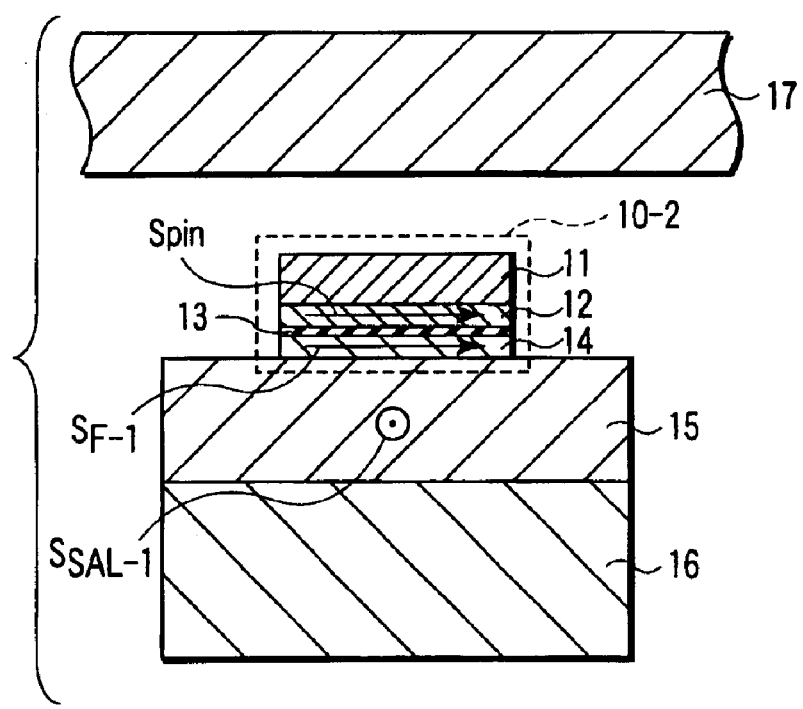
FIG. 2B is a cross sectional view of the first embodiment taken along the 2B—2B line of FIG. 2A as viewed in a direction indicated by the arrows thereof.
Figure 3A:
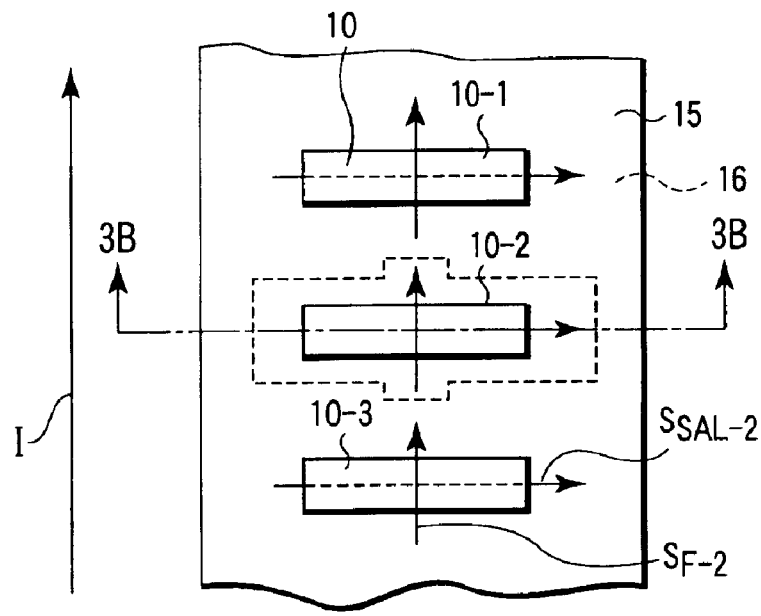
FIG. 3A is a plan view schematically showing the spin states of the free layers and SAL layer and the direction of a current while a current is being caused to flow through the first programming wiring in the magnetic memory device according to the first embodiment.
Figure 3B:
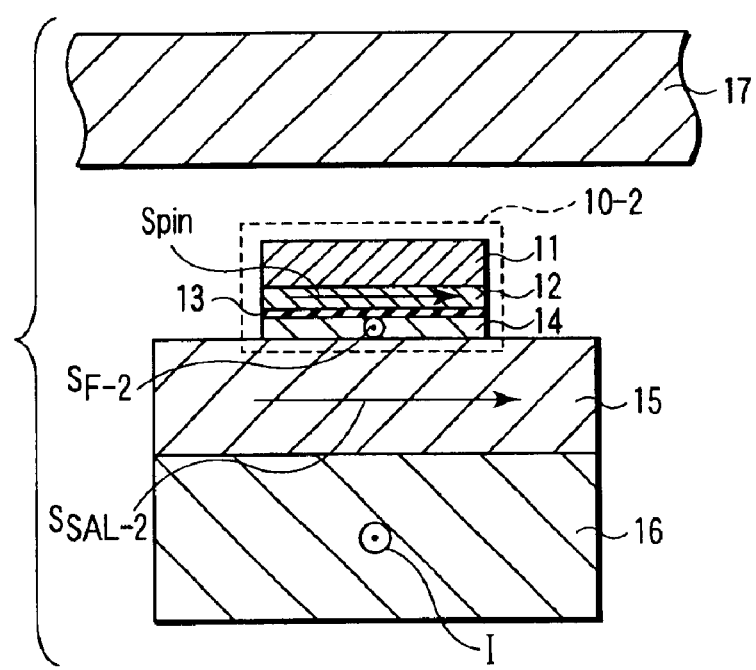
FIG. 3B is a cross sectional view of the first embodiment taken along the 3B—3B line of FIG. 3A as viewed in a direction indicated by the arrows thereof.

FIGS. 2A and 2B schematically show the spin states of the free layers of the MTJ elements 10-1 to 10-3 and the spin state of the SAL layer 15 before passing a current through the first programming wiring 16. On the other hand, FIGS. 3A and 3B schematically show the spin states of the free layers of the MTJ elements 10-1 to 10-3 and the spin state of the SAL layer 15 while a current is being caused to flow through the first programming wiring 16.

First, the spin states of the respective layers before passing a current through the first programming wiring 16 are explained with reference to FIGS. 2A and 2B. FIG. 2A is a plan view schematically showing the spin directions by use of arrows in the magnetic memory device according to the first embodiment shown in FIG. 1A. FIG. 2B is a cross sectional view schematically showing the spin directions of the pin layer 12 and free layer 14 in the MTJ element 10-2 taken along the 2B—2B line of FIG. 2A by use of arrows as viewed in a direction indicated by the arrows thereof.

As shown in FIG. 2A, the direction of the spin $S_{SAL-1}$ of the SAL layer 15 is set in the lengthwise direction of the SAL layer 15 before passing a current through the first programming wiring 16. Likewise, the direction of the spin $S_{F-1}$ of the free layer 14 of each of the MTJ elements 10-1 to 10-3 is set in the lengthwise direction of the MTJ elements 10-1 to 10-3 before passing the current.

Also, in FIG. 2B, the state in which the spin $S_{SAL-1}$ of the SAL layer 15 and the spin $S_{F-1}$ of the free layer 14 are set in the lengthwise directions of the respective layers before passing a current through the first programming wiring 16 is shown. Thus, the magnetic interaction causing ferromagnetic coupling between the SAL layer and the free layers occurs while the direction of the spin $S_{SAL-1}$ of the SAL layer 15 is set in a biquadric state with respect to the direction of the spin $S_{F-1}$ of the free layer 14. In other words, the ferromagnetic coupling occurring between the SAL layer and the free layers is magnetic interaction which acts to hold the biquadric state of the two spins.

Since the direction of the spin $S_{PIN}$ of the pin layer 12 is fixed by the action of the anti-ferromagnetic film 11, the direction of the spin $S_{PIN}$ is kept unchanged before and after passing a current through the first programming wiring 16. In this example, the state in which the direction of the spin $S_{PIN}$ is set parallel to and in the same direction as the direction of the spin $S_{F-1}$ of the free layer 14 is shown in FIG. 2B.

Now, the readout operation is explained by taking the MTJ element 10-2 as an example.

Generally, when information of the MTJ element is read out, a variation in the resistance of the MTJ element 10 is detected. That is, when the directions of the spins of the pin layer and free layer are set parallel and in the same direction as shown in FIG. 2B, the specific resistance of the MTJ element becomes minimum and the state thereof is set to a "1" state, for example. Likewise, when the directions of the spins of the pin layer and free layer are set parallel and in the opposite directions, the resistance of the MTJ element becomes maximum and the state thereof is set to a "0" state, for example. Therefore, information of the MTJ element 10-2 shown in FIG. 2B is read out as the "1" state.

More specifically, the readout operation is performed by sequentially passing a current through the SAL layer 15, free layer 14, tunnel barrier layer 13, pin layer 12, anti-ferromagnetic layer 11 starting from the first programming wiring and detecting the resistance of the MTJ element by use of a sense amplifier (not shown) connected to the first programming wiring 16. Therefore, in the case of FIG. 2B, the specific resistance of the MTJ element 10-2 (the specific resistance between the anti-ferromagnetic layer 11 and the free layer 14) becomes minimum and information thereof is read out as the "1" state by the sense amplifier, for example. The same operation as the above operation is performed in the other MTJ elements 10-1, 10-3.

Further, the spin states of the layers while a current is passed through the first programming wiring 16 in the direction of I at the programming time are explained by use of FIGS. 3A and 3B. FIG. 3A is a plan view schematically showing the spin directions indicated by arrows in the magnetic memory device according to the first embodiment shown in FIG. 1A. FIG. 3B is a cross sectional view schematically showing the spin directions indicated by arrows as viewed in a direction indicated by the arrows of the 3B—3B line of FIG. 3A. Next, the programming operation is explained in detail by taking the MTJ element 10-2 as an example.

As shown in FIGS. 3A and 3B, when a current is caused to flow through the first programming wiring 16 in the direction of I, a magnetic field is generated around the first programming wiring 16 according to the so-called corkscrew rule. Then, most part of the magnetic field generated from the wiring 16 is applied to the SAL layer 15 and almost no magnetic field is applied to the MTJ element 10-2 since a soft magnetic body having sufficiently high magnetic permeability (for example, the magnetic permeability is 1000 or more) is used in the SAL layer 15. Therefore, a large part of the magnetic fluxes generated from the wiring 16 passes through the SAL layer 15 and the direction of the spin $S_{SAL-2}$ of the SAL layer 15 is set in the short-length direction of the SAL layer 15.

As described before, the magnetic interaction having the ferromagnetic coupling which holds the biquadric state between the direction of the spin $S_{SAL-1}$ of the SAL layer 15 and the direction of the spin $S_{F-1}$ of the free layer 14 occurs before passing a current through the first programming wiring 16. The ferromagnetic coupling is maintained even after the current has been passed through the first programming wiring 16 and acts on the spin $S_{F-1}$ of the free layer 14 from the SAL layer 15 to maintain the above relation.

That is, as shown in FIGS. 3A and 3B, if the direction of the spin $S_{SAL-2}$ of the SAL layer 15 is half-reversed and set in the short-length direction of the SAL layer 15, the direction of the spin $S_{F-2}$ of the free layer 14 tends to become perpendicular to the direction of the spin $S_{SAL-2}$ since the ferromagnetic coupling occurs between the SAL layer 15 and the free layer 14. As a result, the direction of the spin $S_{F-2}$ of the free layer 14 is half-reversed and set in the short-length direction of the MTJ element 10-2. Further, since the direction of the spin $S_{PIN}$ of the pin layer 12 is fixed by the action of the anti-ferromagnetic film 11, the direction of the spin $S_{PIN}$ is kept unchanged while a current is being passed through the first programming wiring 16. Therefore, while a current is being passed through the first programming wiring 16, the spin $S_{F-2}$ of the free layer 14 and the spin $S_{PIN}$ of the pin layer 11 become perpendicular to each other. The state is shown in FIGS. 3A and 3B.

The same state is set in the other MTJ elements 10-1, 10-3. That is, the directions of the spins $S_{F-2}$ of the free layers 14 of the MTJ elements 10-1 to 10-3 are set in the short-length directions of the MTJ elements 10-1 to 10-3 by the magnetic field caused by the current flowing in the first programming wiring 16. That is, the directions of the spins of the free layers 14 of the MTJ elements 10-1 to 10-3 are turned by 90° (half-reversed) and all of the MTJ elements are set into the half-selected state.

Further, second programming wirings 17 which are arranged substantially perpendicular to the first programming wiring 16 and respectively disposed above the MTJ elements 10-1 to 10-3 to configure the magnetic memory device as shown in FIG. 3A are formed. Therefore, when the MTJ element 10-2 is programmed, for example, the spin $S_{F-2}$ of the free layer 14 is further turned by 90° by the magnetic field caused by the current flowing through the second programming wiring 17 shown in FIG. 3B and thus the spin is reversed.

As a result, although not shown in the drawing, the direction of the spin $S_{F-2}$ of the free layer 14 and the direction of the spin $S_{PIN}$ of the pin layer 12 are set bilinear to each other and the state is changed from the "1" state to the "0" state, for example. As described above, the entire programming operation for the MTJ element 10-2 is completed.

Likewise, the readout operation after the programming operation is performed by sequentially passing a current through the SAL layer 15, free layer 14, tunnel barrier layer 13, pin layer 12, anti-ferromagnetic layer 11 starting from the first programming wiring 16 and detecting the resistance of the MTJ element by use of a sense amplifier (not shown) coupled to the first programming wiring, for example. Therefore, after programming, the specific resistance of the MTJ element 10-2 (the specific resistance between the anti-ferromagnetic layer 11 and the free layer 14) becomes maximum and information thereof is read out as the "0" state by the sense amplifier, for example.

The same operation as the above operation is performed in the other MTJ elements 10-1, 10-3.

The present embodiment has a feature that the magnetic interaction having the ferromagnetic coupling which holds the biquadric state between the SAL layer 15 and the MTJ elements 10-1 to 10-3 is utilized. That is, the spin direction of the SAL layer 15 is first half-reversed by the magnetic field caused by the first programming wiring 16 at the programming time. Then, the spin direction of the free layer 14 of a desired MTJ element is half-reversed by the magnetic coupling between the SAL layer 15 and the free layer 14. The "1" or "0" programming operation is completed by further half-reversing and completely reversing the spin direction or returning the spin direction without reversing the same by passing a current in a preset direction through the second programming wiring 17. Next, the effect of the present embodiment is explained in detail.

The first effect is to reduce the programming current. When the SAL layer 15 is inserted, the magnetic field which reverses the spin direction of the free layer 14 is reduced and the programming current can be reduced in proportion to a reduction in the magnetic field.

Preferably, the SAL layer 15 is configured by a soft magnetic body having sufficiently high magnetic permeability (for example, the magnetic permeability is 1000 or more) or formed to contain a soft magnetic body.

As described above, since the magnetic permeability of the soft magnetic body is sufficiently high, most part of the magnetic field generated from the first programming wiring 16 is applied to the internal portion of the SAL layer 15 at the programming time. On the other hand, in the conventional case in which the SAL layer 15 is not provided and the magnetic field generated is directly applied to the MTJ element 10, magnetic lines of force of the magnetic field generated from the first programming wiring 16 spread in all directions and the rate at which the magnetic field is applied to the free layer of the MTJ element is low.

On the other hand, in the present embodiment, since most part of the magnetic field generated from the first programming wiring 16 is applied to the internal portion of the SAL layer 15, the magnetic lines of force will not spread in all directions. Further, as shown in FIG. 1B, the SAL layer 15 and free layer 14 are set in direct contact with each other and the magnetic interaction therebetween becomes maximum. As a result, the strength of the magnetic field generated from the first programming wiring 16 to half-reverse the spin direction of the free layer 14 can be lowered in comparison with that in the conventional case and a current to be passed through the first programming wiring 16 can be reduced.

A plurality of MTJ elements 10-1 to 10-3 are arranged along the first programming wiring 16 as shown in FIG. 1A. With this arrangement, the volume of the SAL layer 15 which contributes to programming of the free layer 14 becomes sufficiently large in comparison with the volume of one free layer 14. Further, the SAL layer 15 and the free layer 14 of the MTJ element 10 have the strong magnetic interaction, that is, ferro-magnetic coupling which tends to maintain the angular difference of 90° between the spin directions of the respective layers. That is, the SAL layer 15 of large volume and the free layer 14 of small volume have the coupling therebetween and support each other.

The magnetic moment of the magnetic body is a function of the volume thereof and the magnetic moment becomes larger in proportion to the volume. Further, since the magnitude of the magnetic moment and the magnitude of the spin are proportional, the factor contributing to the spin becomes larger as the magnitude of the magnetic moment is larger.

That is, most part of the magnetic fluxes generated from the first programming wiring 16 is applied to the SAL layer 15 of large volume to half-reverse the spin of the SAL layer 15. Then, the spin of the free layer 14 of small volume is half-reversed by the magnetic coupling. At this time, the volume of the magnetic body contributing to the magnetic reverse is increased in comparison with a case wherein the spin is half-reversed only by the free layer 14 since the SAL layer 15 is used. This means that the magnetic moment increases and the factor which contributes to the spin increases. Therefore, the strength of the magnetic field required for half-reversing the spin of the free layer 14 is lowered and the programming current can be reduced.

The second effect is to prevent erroneous programming of the adjacent MTJ element at the programming time and enlarge the allowable range of the programming current. As shown in FIG. 3A, the spin $S_{F-2}$ of the free layer 14 is half-reversed by the magnetic field generated from the first programming wiring 16 and set in the short-length direction thereof. As a result, a plurality of MTJ elements are set into the half-selected state (MTJ elements 10-1 to 10-3).

Further, in order to completely reverse the spin, that is, in order to program data into a specified memory cell, a resultant magnetic field obtained by combining the above magnetic field with the magnetic fields generated from the second programming wirings 17 arranged substantially perpendicular to the first programming wiring 16 and respectively provided above the MTJ elements 10-1 to 10-3 is utilized. Therefore, when the programming operation is performed by use of the magnetic fields generated from the second programming wirings 17 in the state shown in FIG. 3A, it is necessary to prevent the MTJ element 10 which is not selected from being programmed.

For example, assume now that the spin direction is further half-reversed by the magnetic field generated from the second programming wiring 17 in the state shown in FIG. 3A, the spin direction of the free layer 14 of the MTJ element 10-2 is completely reversed and the complete programming operation is performed. At this time, the magnetic field generated from the second programming wiring 17 which lies above the MTJ element 10-2 also acts on the MTJ elements 10-1, 10-3.

In this case, the MTJ elements 10-1, 10-3 are set in the half-selected state in the state shown in FIG. 3A. Therefore, if the resultant magnetic field generated from the first, second programming wirings 16, 17 becomes stronger than the reversing magnetic field for some reasons and acts on the MTJ elements 10-1, 10-3, there occurs a possibility that the programming operation for the MTJ elements 10-1, 10-3 which is not originally desired will be performed.

In addition, if a large-scale array is used, the magnetic fields generated from the first, second programming wirings interfere with one another. Therefore, the distribution of the strength of the switching magnetic fields of the MTJ elements arranged in an array form occurs and the permitted value of the programming current in the conventional case becomes smaller when taking the above distribution into consideration.

However, in the present embodiment, the SAL layer 15 is formed to contain a soft magnetic body having high magnetic permeability or formed to contain at least a soft magnetic body. Therefore, most part of the magnetic lines of force generated from the first programming wiring 16 passes through only the internal portion of the SAL layer 15. Thus, the generated magnetic lines of force can be prevented from spreading in all directions without passing through the SAL layer 15 and an influence of the generated magnetic field can be given only to the desired MTJ element. Therefore, the generated magnetic fields will not interfere with one another even when the large-scale array is used and the distribution of the strength of the switching magnetic fields of the spins of the MTJ elements becomes difficult to occur. As a result, erroneous programming of the MTJ element which is adjacent to the selected MTJ element at the programming time can be prevented.

Further, the whole portion of the magnetic memory device can be integrated based on the first and second effects. In the conventional case, since the programming current cannot be reduced as described before, it is only possible to increase the programming current. However, due to the problem of electromigration caused in the programming wiring, the programming wiring can be made smaller to the limit thereof.

In the present embodiment, the programming current can be reduced as described before. Therefore, the cross sectional area of the first programming wiring 16 can be made smaller than in the conventional case. As a result, each of the MTJ elements can be made smaller with a reduction in the size of the programming wiring and the whole portion of the magnetic memory device can be integrated with high integration density.

Further, the layout area in the lengthwise or longitudinal direction of the first programming wiring 16 can be reduced by use of the layout shown in FIG. 1A. That is, as shown in FIG. 1A, the short-length direction of the MTJ elements 10-1 to 10-3 and the lengthwise directions of the first programming wiring 16 and SAL layer 15 are set in the same direction. Therefore, the layout area in the lengthwise direction of the wiring 16 can be reduced according to the above layout.

It is generally preferable to use a soft magnetic alloy having large Ni content as the SAL layer, but any material having a physical property as the soft magnetic body can be used as the SAL layer.

Further, in the present embodiment, as described before, the spin in the direction of the hard axis of the MTJ element is reversed by use of the SAL layer 15, but the SAL layer can be used to reverse the spin in the direction of the easy axis. This is because, for example, the same effect that the programming current can be reduced can be attained even when the SAL layer is used to reverse the spin in the direction of the easy axis.

Further, in the present embodiment, as described before, the SAL layer 15 of large volume has magnetic interaction with respect to the free layer 14 of small volume and they support each other. Therefore, at the programming time shown in FIGS. 2A, 2B, 3A, 3B, the effect that thermal agitation of the free layer 14 can be reduced can be attained.

In the present embodiment, only the direct exchange interaction in which the SAL layer 15 and free layer 14 have direct coupling among the magnetic interactions is explained, but nail coupling, static magnetic interaction or the like can be considered as the magnetic interaction.

The nail coupling is interaction occurring between the tunnel barrier layer 13 and the free layer 14 when the surface of the tunnel barrier layer 13 of the MTJ element 10-2 of FIG. 1B, for example, is uneven or rough.

Further, the static magnetic interaction is interaction caused by a magnetic field which leaks from the end portion of the pin layer 12 of the MTJ element 10-2 and gives an influence to the free layer 14.

However, since the above magnetic interactions are negligibly small in comparison with the direct exchange interaction, it is not necessary to take an influence of the magnetic interactions into consideration. Therefore, for example, it is not necessary to intentionally make the surfaces of the free layer 14 and the tunnel barrier layer 13 rough so as to cause large nail coupling. That is, in the case of the present embodiment, only the direct exchange interaction which causes the magnetic coupling between the SAL layer 15 and the free layer 14 is taken into consideration and the interaction can exclusively be utilized.

[Second Embodiment]

Figure 4:
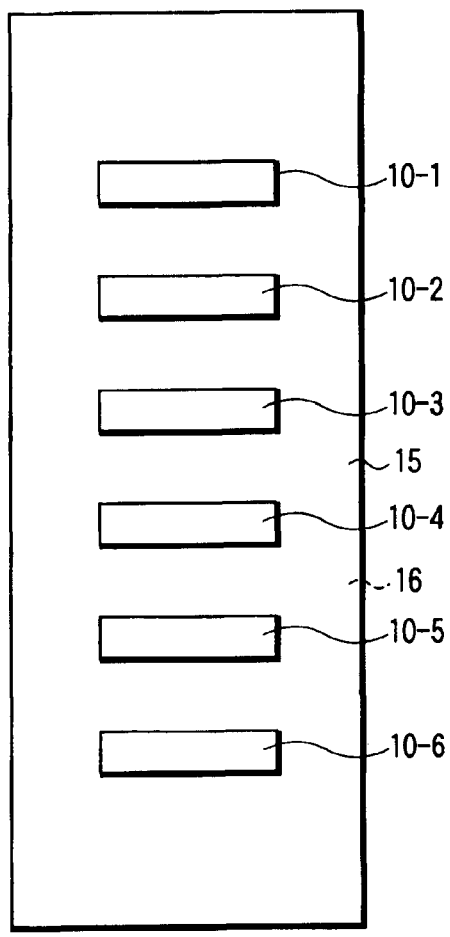
FIG. 4 is a plan view of a magnetic memory device according to a second embodiment of this invention.

FIG. 4 shows a second embodiment of this invention. FIG. 4 is a plan view schematically showing the configuration of a magnetic memory device according to the second embodiment. As shown in FIG. 4, the magnetic memory device includes a plurality of (in this example, six) MTJ elements 10-1 to 10-6 arranged in the wiring lengthwise direction of a first programming wiring 16 and a SAL layer 15 formed to overlap the first programming wiring 16 and having magnetic interaction with respect to the MTJ elements 10-1 to 10-6. Further, as shown in FIG. 4, the MTJ elements 10-1 to 10-6 are arranged so that the short-length direction of the MTJ elements 10-1 to 10-6 will be set in substantially the same direction as the lengthwise direction of the first programming wiring 16.

In the following explanation for the second embodiment, the same reference symbols are attached to those portions which are similar to the corresponding portions of the first embodiment, the explanation thereof is omitted and the configuration which is different from that of the first embodiment is explained.

The present embodiment has a feature that the SAL layer 15 is disposed on the first programming wiring 16 so that the magnetic property thereof will be substantially uniformly exhibited on the entire portion thereof.

Generally, it is difficult to dispose the SAL layer 15 of a soft magnetic body so as to cause desired magnetic interaction on each of the MTJ elements 10-1 to 10-6. However, in the present embodiment, it is possible to dispose the SAL layer 15 so as to cause desired magnetic interaction on each of the MTJ elements 10-1 to 10-6 by controlling and making the film thickness of the SAL layer 15 or the like uniform. Therefore, the manufacturing process can be simplified and the manufacturing cost can be lowered without adding the structures as explained in the following embodiments shown in FIG. 5, for example, to the SAL layer 15.

The other operation and effect are the same as those of the first embodiment.

[Third Embodiment]

Figure 5:
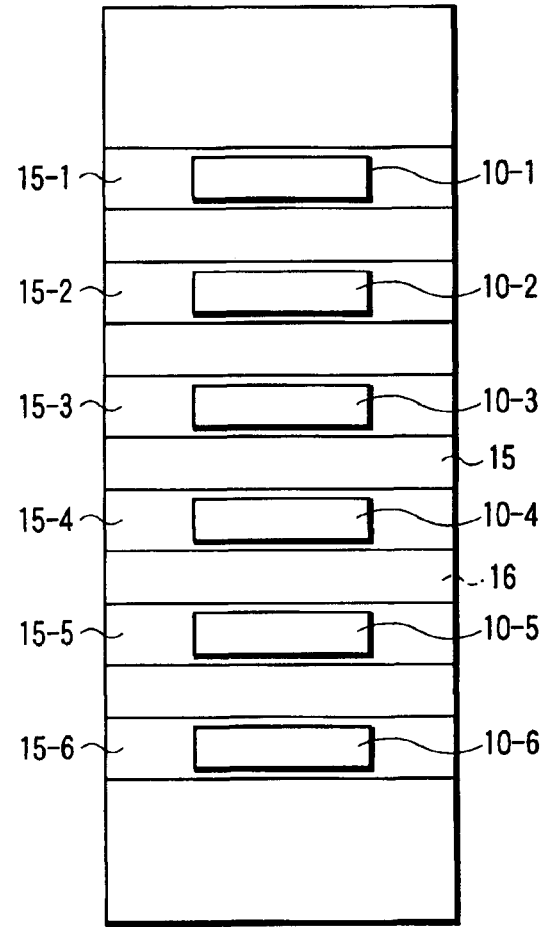
FIG. 5 is a plan view of a magnetic memory device according to a third embodiment of this invention.

FIG. 5 shows a third embodiment of this invention. FIG. 5 is a plan view of a magnetic memory device which includes a plurality of MTJ elements 10-1 to 10-6 arranged in the wiring lengthwise direction of a first programming wiring 16 and SAL layers 15-1 to 15-6 formed to overlap the first programming wiring 16 and having magnetic interactions with respect to the MTJ elements 10-1 to 10-6. Further, the MTJ elements 10-1 to 10-6 are arranged so that the short-length direction of the MTJ elements 10-1 to 10-6 will be set in substantially the same direction as the lengthwise direction of the first programming wiring 16.

The present embodiment has a feature that the SAL layers 15-1 to 15-6 are divided for the respective MTJ elements 10-1 to 10-6.

There occurs no problem in the programming operation if the SAL layer is disposed with the uniform thickness and formed commonly for the plurality of MTJ elements 10-1 to 10-6 so as to cause desired magnetic interaction on the MTJ elements 10-1 to 10-6 as in the second embodiment shown in FIG. 4. However, as described before, it is difficult to commonly form the SAL layer having the soft magnetic body so as to cause desired magnetic interaction with respect to the MTJ elements.

Therefore, in the present embodiment, the magnetic domains and curlings of the SAL layers 15-1 to 15-6 can be controlled by dividing and forming the SAL layers 15-1 to 15-6 for the respective MTJ elements 10-1 to 10-6. That is, if the SAL layers 15-1 to 15-6 are divided for the respective MTJ elements 10-1 to 10-6, the magnetic field caused by a current flowing in the first programming wiring 16 which is commonly formed for the SAL layers 15-1 to 15-6 is applied, for example, from the SAL layer 15-1 to the corresponding MTJ element 10-1 without fail.

This is because the SAL layers 15-1 to 15-6 contain soft magnetic bodies having high magnetic permeability and the magnetic resistances of the SAL layers 15-1 to 15-6 are extremely low in comparison with that of the first programming wiring 16. Therefore, most part of the generated magnetic field is applied to the internal portions of the SAL layers 15-1 to 15-6. That is, the magnetic fields are applied to the MTJ elements 10-1 to 10-6 which are directly coupled to the upper surfaces of the respective SAL layers 15-1 to 15-6 without fail.

Therefore, even if the SAL layers 15-1 to 15-6 cannot be formed with the uniform thickness, the generated magnetic field of the SAL layer can be applied to a corresponding one of the MTJ elements 10-1 to 10-6 without fail by forming the layout of the SAL layers 15-1 to 15-6 as in the present embodiment.

The other operation and effect are the same as those of the first embodiment.

[Fourth Embodiment]

Figure 6:
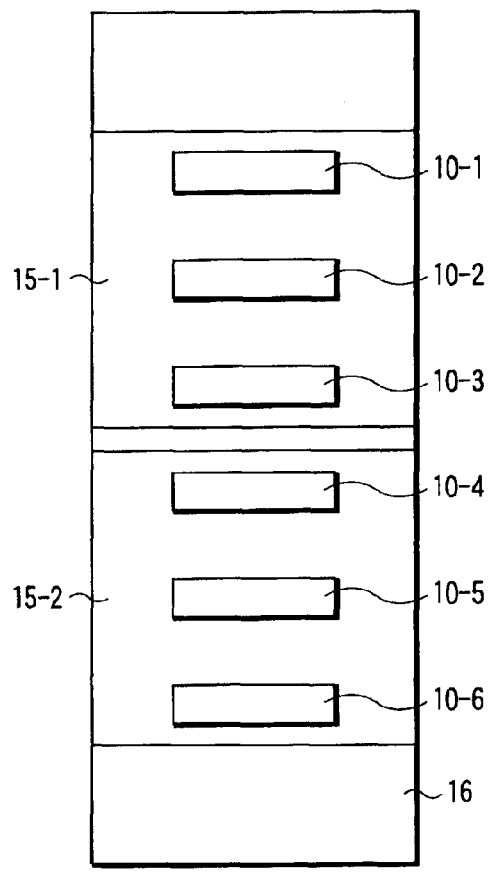
FIG. 6 is a plan view of a magnetic memory device according to a fourth embodiment of this invention.

FIG. 6 shows a fourth embodiment of this invention. FIG. 6 is a fourth plan view of a magnetic memory device which includes a plurality of MTJ elements 10-1 to 10-6 arranged in the wiring lengthwise direction of a first programming wiring 16 and SAL layers 15-1 and 15-2 formed to overlap the first programming wiring 16 and respectively having magnetic interactions with respect to the MTJ elements 10-1 to 10-3 and 10-4 to 10-6. Further, the MTJ elements 10-1 to 10-6 are arranged so that the short-length direction of the MTJ elements 10-1 to 10-6 will be set in substantially the same direction as the lengthwise direction of the first programming wiring 16.

The present embodiment has a feature that the SAL layer is divided into two sections so that the SAL layer 15-1 will correspond to the three MTJ elements 10-1 to 10-3 and the SAL layer 15-2 will correspond to the three MTJ elements 10-4 to 10-6. The magnetic domains of the SAL layers 15-1, 15-2 can be controlled and the programming operation of the MTJ elements 10-1 to 10-6 can be realized based on the same operation as in the third embodiment shown in FIG. 5 by forming the layout of the SAL layers 15-1, 15-2.

Further, since the SAL layers 15-1, 15-2 are divided not for each MTJ element, but for every preset number of MTJ elements, for example, for every three MTJ elements 10-1 to 10-3, 10-4 to 10-6, in this example, the manufacturing process can be simplified, the manufacturing cost can be lowered and the manufacturing speed can be enhanced in comparison with the case of the third embodiment shown in FIG. 5.

A case wherein the SAL layers 15-1, 15-2 are each formed for every three MTJ elements is shown in the present embodiment of FIG. 6, but the number of MTJ elements is not limited to three and can be set to any number other than one.

The other operation and effect are the same as those of the first embodiment.

[Fifth Embodiment]

Figure 7:
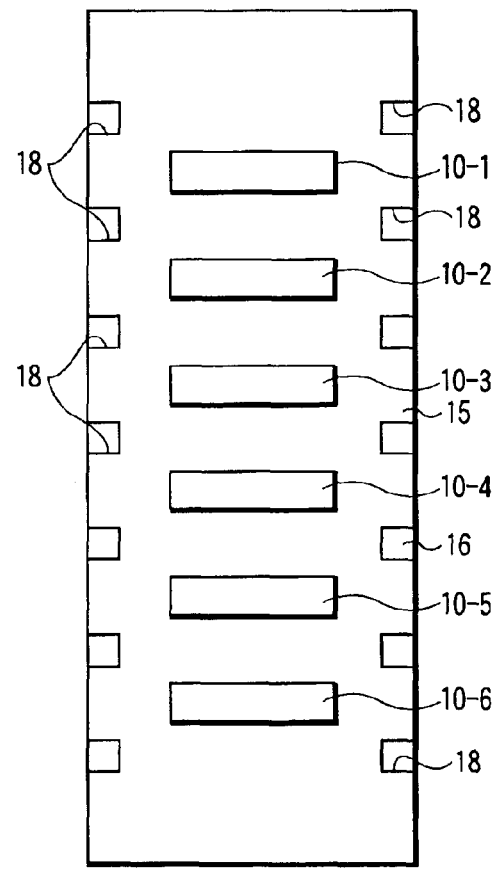
FIG. 7 is a plan view of a magnetic memory device according to a fifth embodiment of this invention.

FIG. 7 shows a fifth embodiment of this invention. FIG. 7 is a fifth plan view of a magnetic memory device which includes a plurality of MTJ elements 10-1 to 10-6 arranged in the wiring lengthwise direction of a first programming wiring 16 and a SAL layer 15 formed to overlap the first programming wiring 16 and having magnetic interaction with respect to the MTJ elements 10-1 to 10-6. Further, the MTJ elements 10-1 to 10-6 are arranged so that the short-length direction of the MTJ elements 10-1 to 10-6 will be set in substantially the same direction as the lengthwise direction of the first programming wiring 16.

The present embodiment has a feature that cut-away portions are formed in both end portions of the SAL layer 15 along the lengthwise direction thereof for the respective MTJ elements. That is, as shown in FIG. 7, cut-away portions 18 are formed in both end portions of the SAL layer 15 adjacent to the respective MTJ elements 10-1 to 10-6 and portions of the first programming wiring 16 which lie under the cut-away portions are exposed via the cut-away portions 18.

Also, in the present embodiment, the magnetic domain of the SAL layer 15 or the like can be controlled to realize the programming operation of the MTJ elements 10-1 to 10-6 without fail.

As shown in FIG. 7, the magnetic resistance of the cutaway portions 18 formed in both end portions of the SAL layer 15 becomes extremely high based on the same operation as in the embodiment of FIG. 5 in comparison with that of portions of the SAL layer 15 on which the MTJ elements 10-1 to 10-6 are formed. Therefore, the magnetic field generated from the first programming wiring 16 is scarcely applied to the cut-away portions 18 and is mostly applied only to the internal portions of the SAL layer 15 lying near the MTJ elements 10-1 to 10-6. Therefore, the magnetic field generated from the first programming wiring 16 is selectively and inevitably applied to the desired MTJ elements 10-1 to 10-6 to realize the stable programming operation.

The other operation and effect are the same as those of the first embodiment.

[Sixth Embodiment]

Figure 8:
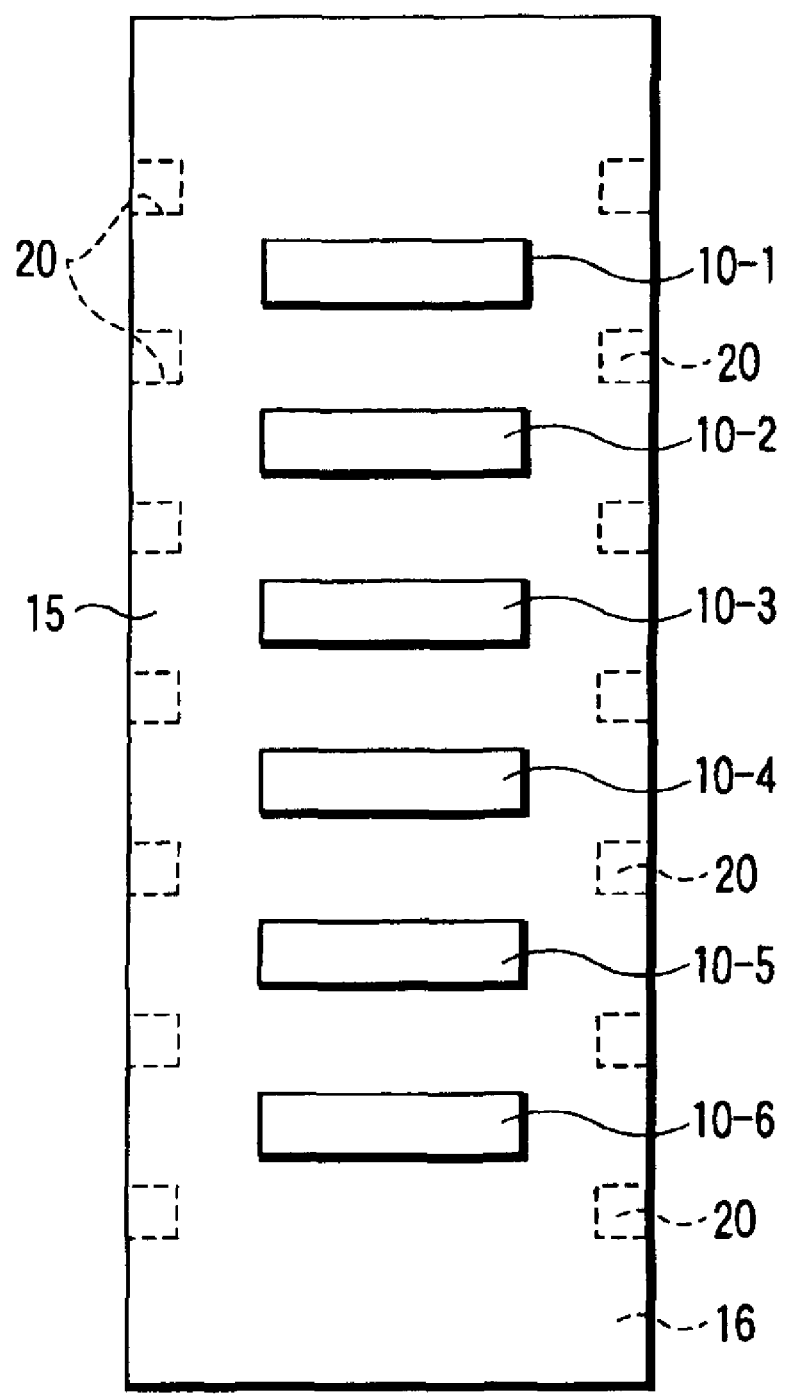
FIG. 8 is a plan view of a magnetic memory device according to a sixth embodiment of this invention.

FIG. 8 shows a sixth embodiment of this invention. FIG. 8 is a plan view of a magnetic memory device which includes a plurality of MTJ elements 10-1 to 10-6 arranged in the wiring lengthwise direction of a first programming wiring 16 and a SAL layer 15 formed to overlap the first programming wiring 16 and having magnetic interaction with respect to the MTJ elements 10-1 to 10-6. Further, the MTJ elements 10-1 to 10-6 are arranged so that the short-length direction of the MTJ elements 10-1 to 10-6 will be set in substantially the same direction as the lengthwise direction of the first programming wiring 16.

As shown in FIG. 8, the present embodiment has a feature that projections 20 are formed on both end portions of the SAL layer 15 along the lengthwise direction thereof for the respective MTJ elements. By thus forming the projections 20 on both end portions of the SAL layer 15, the same effect as that of the fifth embodiment shown in FIG. 7 can be attained. That is, the magnetic resistance of the projections 20 formed on the SAL layer 15 becomes high in comparison with that of the other portions of the SAL layer 15. Therefore, the magnetic field generated from the first programming wiring 16 is applied to the internal portion of the SAL layer 15 without being applied to the projections 20.

Thus, the generated magnetic field is selectively and inevitably applied to the desired MTJ elements 10-1 to 10-6 to realize the stable programming operation.

The other operation and effect are the same as those of the first embodiment.

As described above, in the second to sixth embodiments, the trap mechanism of partial magnetic domain walls is added to the SAL layer 15 by use of various methods and the magnetic domains and curlings in the SAL layer 15 can be controlled. Therefore, the generated magnetic field is inevitably and selectively applied to the MTJ elements to realize the stable programming operation.

[Seventh Embodiment]

Figure 9A:
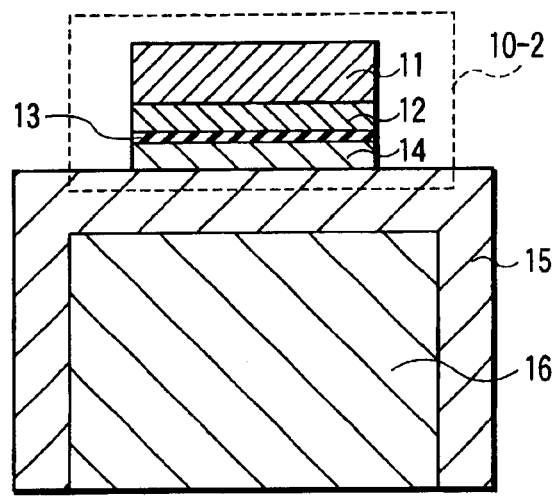
FIG. 9A is a cross sectional view of a magnetic memory device according to a seventh embodiment of this invention.

FIG. 9A is a cross sectional view of a magnetic memory device according to a seventh embodiment of this invention. FIG. 9A is a cross sectional view of an MTJ element portion of the magnetic memory device as viewed in the same direction as that in FIG. 1B. That is, the plan view of the present embodiment is the same as that of FIG. 1A, but as shown in FIG. 9A, the cross sectional structure of the present embodiment is featured in that the SAL layer 15 is also formed on both side surfaces of the first programming wiring 16.

The same reference symbols are attached to those portions which are similar to the corresponding portions of the first embodiment, the explanation thereof is omitted and the configuration which is different from that of the first embodiment is explained below.

In the first cross sectional view shown in FIG. 1B, the SAL layer 15 is formed only on the upper surface of the first programming wiring 16. In the present embodiment, the SAL layer 15 is also formed on both side surfaces of the first programming wiring 16.

Therefore, magnetic field components generated from the both side surfaces of the wiring 16 among the magnetic field generated from the first programming wiring 16 can entirely be applied to the SAL layer 15. Thus, by increasing the area of the SAL layer 15 which covers the first programming wiring 16, a larger part of the magnetic field generated from the wiring 16 can stably be applied to the SAL layer 15 without dispersing to different portions.

As a result, it is possible to attain the effect that the programming current can be further reduced, erroneous programming of the adjacent MTJ element at the programming time can be prevented and the allowable range of the programming current can be enlarged.

In the present embodiment, the cross sectional structure of the SAL layer corresponding to the MTJ element portion of the magnetic memory device is shown. Therefore, the structure of the SAL layer between the adjacent MTJ elements can be combined with any one of the structures of the second to sixth embodiments. That is, if each modification of the embodiment is expressed by use of (cross sectional structure, plane structure), five modifications of (FIG. 9A, FIG. 4), (FIG. 9A, FIG. 5), (FIG. 9A, FIG. 6), (FIG. 9A, FIG. 7), (FIG. 9A, FIG. 8) can be considered, for example.

[Eighth Embodiment]

Figure 9B:
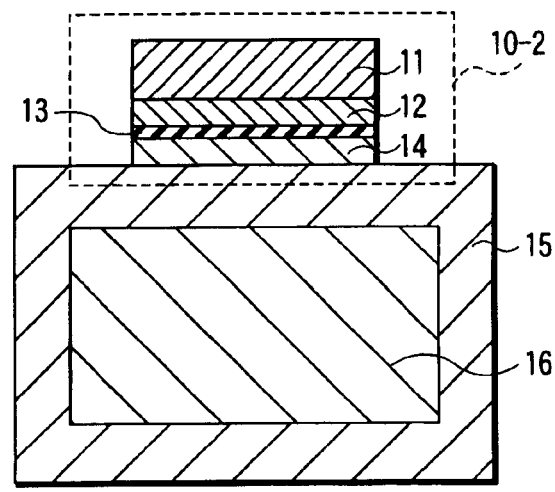
FIG. 9B is a cross sectional view of a magnetic memory device according to an eighth embodiment of this invention.

FIG. 9B is a cross sectional view of a magnetic memory device according to an eighth embodiment of this invention. FIG. 9B shows a cross sectional structure as viewed in the same direction as that in FIG. 1B. That is, as shown in the cross sectional structure of FIG. 9B, the present embodiment is featured in that a SAL layer 15 is formed to cover the entire surfaces of a first programming wiring 16.

The same reference symbols are attached to those portions which are similar to the corresponding portions of the seventh embodiment, the explanation thereof is omitted and the configuration which is different from that of the seventh embodiment is explained below.

With the configuration of the present embodiment, a magnetic field component generated from the rear surface of the wiring 16 in addition to magnetic field components generated from the front surface and both side surfaces of the wiring 16 among the magnetic field generated from the first programming wiring 16 can also be applied to the SAL layer 15. Thus, by further increasing the area of the SAL layer 15 which covers the first programming wiring 16, the entire portion of the magnetic field generated from the wiring 16 can be applied to the SAL layer 15 without dispersing to different portions.

As a result, it is possible to attain the effect that the programming current can be further reduced, erroneous programming of the adjacent MTJ element at the programming time can be prevented and the allowable range of the programming current can be enlarged.

In the present embodiment, the cross sectional structure of the SAL layer corresponding to the MTJ element portion of the magnetic memory device is shown. Therefore, the present embodiment can be combined with any one of the structures of the second to sixth embodiments like the case of FIG. 9A. That is, if each modification of the embodiment is expressed by use of (cross sectional structure, plane structure), five modifications of (FIG. 9B, FIG. 4), (FIG. 9B, FIG. 5), (FIG. 9B, FIG. 6), (FIG. 9B, FIG. 7), (FIG. 9B, FIG. 8) can be considered, for example.

[Ninth Embodiment]

Figure 9C:
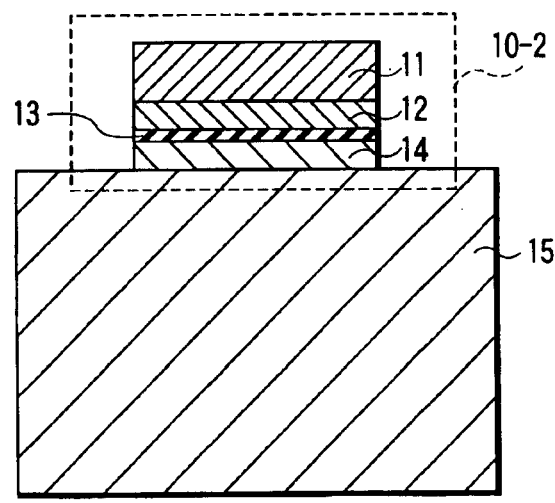
FIG. 9C is a cross sectional view of a magnetic memory device according to a ninth embodiment of this invention.

FIG. 9C is a cross sectional view of a magnetic memory device according to a ninth embodiment of this invention.

FIG. 9C shows a cross sectional structure of the magnetic memory device as viewed in the same direction as that of FIG. 1B. That is, as shown in FIG. 9C, the present embodiment is featured in that a SAL layer 15 itself is also used as a first programming wiring 16.

The same reference symbols are attached to those portions which are similar to the corresponding portions of the seventh embodiment, the explanation thereof is omitted and the configuration which is different from that of the seventh embodiment is explained below.

With the configuration of the present embodiment, since the SAL layer 15 is configured to function as the first programming wiring, a magnetic field generated when a current is passed through the SAL layer 15 is mostly held inside the SAL layer and will hardly disperse to the exterior.

As a result, like the embodiments described so far, it is possible to attain the effect that the programming current can be reduced, erroneous programming of the adjacent MTJ element at the programming time can be prevented and the allowable range of the programming current can be enlarged.

Further, since the SAL layer 15 is formed to be also used as the first programming wiring, the manufacturing step of forming the first programming wiring 16 can be omitted. Therefore, since the manufacturing process can be simplified and the area of the cross section corresponding to the first programming wiring 16 can be omitted, the integration density of the device in the vertical direction can be enhanced.

In the present embodiment, the cross sectional structure of the MTJ element portion of the magnetic memory device is shown. Therefore, the present embodiment can be combined with any one of the structures of the SAL layers of the second to sixth embodiments. That is, if each modification of the embodiment is expressed by use of (cross sectional structure, plane structure), five cases of (FIG. 9C, FIG. 4), (FIG. 9C, FIG. 5), (FIG. 9C, FIG. 6), (FIG. 9C, FIG. 7), (FIG. 9C, FIG. 8) can be considered, for example.

For example, like the embodiment of FIG. 1B, the second programming wiring is necessary in the embodiments of FIGS. 9A to 9C, but it is omitted for simplicity of the drawing. Likewise, the second programming wiring is omitted in embodiments described below.

[Tenth Embodiment]

Figure 10:
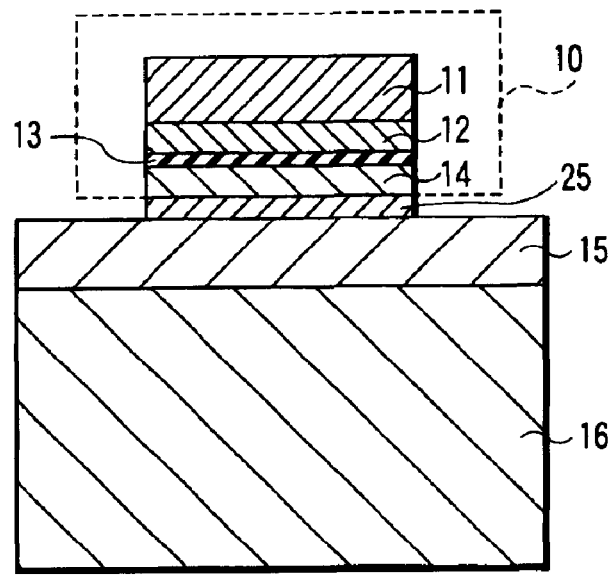
FIG. 10 is a cross sectional view of a magnetic memory device according to a tenth embodiment of this invention.

FIG. 10 is a cross sectional view of an MTJ element portion according to another embodiment taken along the same line as in FIG. 1B. That is, since the plane structure is the same as that of the first embodiment shown in FIG. 1A and only the cross sectional structure is different from that of the first embodiment, the plan view is omitted. The present embodiment is explained in detail with reference to FIG. 10.

The present embodiment is featured in that an interlaid film 25 having substantially the same area as an MTJ element 10 is inserted between a free layer 14 of the MTJ element 10 and a SAL layer 15 disposed on a first programming wiring 16. The interlaid film 25 is a film which is formed of a non-magnetic conductive body and formed to cause magnetic interaction between the free layer 14 and the SAL layer 15. The same reference symbols are attached to those portions which are similar to the corresponding portions of the first embodiment, the explanation thereof is omitted and the configuration which is different from that of the first embodiment is explained below.

As the first interlaid film 25, it is preferable to form a film which contains at least one of Cu, Ru, Au, Cr and whose film thickness is adequately controlled so as to permit magnetic interaction to occur between the free layer 14 and the SAL layer 15.

The present embodiment has a feature that magnetic interaction is caused between the free layer 14 of the MTJ element 10 and the SAL layer 15 via the first interlaid film 25 having substantially the same area as the MTJ element 10.

As described before, like the first embodiment, a second programming wiring is disposed above the MTJ element 10 and arranged substantially perpendicular to the first programming wiring 16, but it is omitted in FIG. 10.

Further, the programming operation is the same as that in the first embodiment even if the interlaid film 25 is inserted. That is, if a current is passed through the first programming wiring 16, ferromagnetic coupling which holds the biquadric state between the free layer 14 and the SAL layer 15 via the interlaid film 25 is maintained and the spin directions of the free layer 14 and SAL layer 15 are set into half-reversed positions.

By further half-reversing the spin directions by the magnetic field generated from the second programming wiring (not shown) disposed above the MTJ element 10 to set the spin directions of the free layer 14 and SAL layer 15 completely parallel or bilinear to each other, the programming operation of the MTJ element 10 is terminated.

Likewise, the readout operation is performed by sequentially passing a current through the SAL layer 15, non-magnetic conductive layer 25, free layer 14, tunnel barrier layer 13, pin layer 12, anti-ferromagnetic layer 11 starting from the first programming wiring 16 and detecting the resistance by use of a sense amplifier (not shown) connected in series.

Thus, since the ferromagnetic coupling which holds the biquadric state between the free layer 14 and the SAL layer 15 is formed even if the conductive interlaid film 25 is inserted, the programming current can be reduced.

Further, interference of the magnetic fields generated at the time of programming of the adjacent MTJ elements can be prevented and the allowable range of the programming current can be enlarged.

Further, in the present embodiment, an influence of the residual magnetic field occurring between the adjacent MTJ elements 10 at the end time of the programming operation can be rapidly eliminated. Therefore, the programming current can be reduced, interference of the generated magnetic fields between the adjacent MTJ elements can be prevented and the programming time can be shortened.

That is, since the interlaid film 25 is a conductor and naturally conducts a current, the readout operation is not obstructed by the presence of the interlaid film and can be performed. Further, since the interlaid film 25 is of a non-magnetic material, it plays a role as a magnetic barrier which prevents an influence of an extra magnetic field generated from the first programming wiring 16 from being applied to the adjacent MTJ element. This is because the influence of the residual magnetic field remaining in the SAL layer 15 on the free layer 14 can be eliminated by the presence of the first interlaid film 25 after the spin direction of the desired free layer 14 is half-reversed by the magnetic field generated from the first programming wiring 16.

Therefore, an influence of an extra magnetic field generated at the programming time can be eliminated.

The other effect is the same as that of the first embodiment.

Further, since the present embodiment relates to the MTJ element portion of the magnetic memory device, various modifications can be considered by combining the present embodiment with the various structures of the SAL layers in the embodiments described above. That is, it is possible to make modifications of the SAL layers with the same plan views as those of the second to sixth embodiments shown in FIGS. 4 to 8 except that the conductive interlaid film 25 having substantially the same area as the MTJ element 10 is inserted between the MTJ element 10 and the SAL layer 15. Further, the second to fourth cross sectional structures shown in FIGS. 9A to 9C are considered as the cross sectional structure of the SAL layer.

Therefore, if each modification of the embodiment attained by a combination of the plane structure and cross sectional structure of the SAL layer when the interlaid film 25 is inserted as in the present embodiment is expressed by use of (cross sectional structure, plane structure), the following modifications can be considered, for example. That is, twenty modifications of (FIG. 10, FIGS. 4 to 8), (FIG. 10+FIG. 9A, FIGS. 4 to 8), (FIG. 10+FIG. 9B, FIGS. 4 to 8), (FIG. 10+FIG. 9C, FIGS. 4 to 8) can be considered.

For example, the cross sectional structure expressed by (FIG. 10+FIG. 9A) indicates a cross sectional structure in which the interlaid film 25 is formed as in the present embodiment and the SAL layer 15 is also formed on both side surfaces of the first programming wiring 16 as shown in FIG. 9A. The cross sectional structures expressed by (FIG. 10+FIG. 9B), (FIG. 10+FIG. 9C) indicate the same type of cross sectional structure.

[Eleventh Embodiment]

Figure 11:
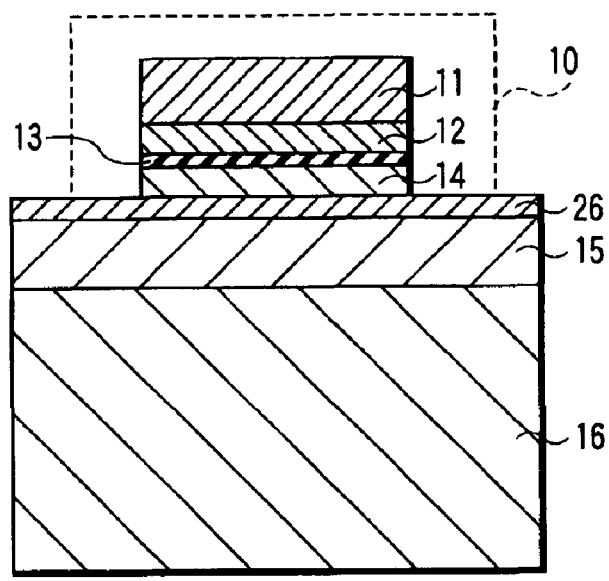
FIG. 11 is a cross sectional view of a magnetic memory device according to an eleventh embodiment of this invention.

FIG. 11 is a cross sectional view of an MTJ element portion according to another embodiment taken along the same line as in FIG. 1B. The present embodiment has substantially the same plane structure as in the first embodiment. Next, the present embodiment is explained in detail with reference to FIG. 11.

The present embodiment is featured in that an interlaid film 26 having substantially the same area as an SAL layer 15 is inserted between a free layer 14 of an MTJ element 10 and the SAL layer 15 disposed on a first programming wiring 16. The same reference symbols are attached to those portions which are similar to the corresponding portions of the first embodiment, the explanation thereof is omitted and the configuration which is different from that of the tenth embodiment is explained below.

The present embodiment has a feature that the interlaid film 26 which has substantially the same area as the SAL layer 15 is inserted. Like the interlaid film 25 of FIG. 10, the interlaid film 26 is formed of a non-magnetic conductive body and the MTJ element is formed to cause magnetic interaction between the free layer 14 and the SAL layer 15 via the interlaid film 26. The explanation for the structure which is the same as that of the tenth embodiment is omitted.

Like the tenth embodiment, the programming operation is performed by maintaining ferromagnetic coupling to keep the biquadric state between the free layer 14 and the SAL layer 15 via the interlaid film 26 after a current is passed through the first programming wiring 16 and setting the spin directions of the free layer 14 and SAL layer 15 into the half-reversed state. Moreover, the spin direction of the free layer 14 is further half-reversed by the magnetic field generated from a second programming wiring (not shown) disposed above the MTJ element 10 and set into a desired reversed state or non-reversed state, and thus, the programming operation of the MTJ element 10 is terminated.

Like the tenth embodiment, the readout operation is performed by sequentially passing a current through the SAL layer 15, interlaid film 26, free layer 14, tunnel barrier layer 13, pin layer 12, anti-ferromagnetic layer 11 starting from the first programming wiring 16 and detecting the resistance by use of a sense amplifier (not shown) connected in series.

Thus, since the ferromagnetic coupling which holds the biquadric state between the free layer 14 and the SAL layer 15 is formed even if the interlaid film 26 is inserted, the programming current can be reduced.

As described before, the present embodiment has a feature that the interlaid film 26 which has substantially the same area as the SAL layer 15 is inserted between the free layer 14 and SAL layer 15 of the MTJ element 10. As shown in FIG. 11, in the present embodiment, the interlaid film 26 is disposed with substantially the same area as the SAL layer 15. Therefore, the volume and area of the interlaid film 26 which covers the SAL layer 15 are increased in comparison with those of the interlaid film 25 of the tenth embodiment shown in FIG. 10.

Therefore, the interlaid film 26 plays a role as the magnetic barrier which can prevent an influence of an extra magnetic field generated from the first programming wiring 16 from being given to the other adjacent MTJ elements. Therefore, an influence by an extra programming magnetic field can be rapidly eliminated.

The other effect is the same as that of the first embodiment.

Further, like the tenth embodiment, various modifications can be considered by combining the cross sectional structures and plane structures of the SAL layers 16. That is, it is possible to make the same modifications as those of the tenth embodiment except that the interlaid film 26 having substantially the same area as the SAL layer 15 is inserted between the MTJ element 10 and the SAL layer 15.

For example, the cross sectional structure expressed by (FIG. 11+FIG. 9A) indicates a cross sectional structure which has the interlaid film 26 as in the present embodiment and the SAL layer 15 is also disposed on both side surfaces of the first programming wiring 16 as shown in FIG. 9A. The cross sectional structures expressed by (FIG. 11+FIG. 9B), (FIG. 11+FIG. 9C) indicate the same type of cross sectional structure.

Like the interlaid film 25, as the interlaid film 26, it is preferable to form a film which contains at least one of Cu, Ru, Au, Cr and whose film thickness is adequately controlled so as to permit magnetic interaction to occur between the free layer 14 and the SAL layer 15.

[Twelfth Embodiment]

Figure 12A:
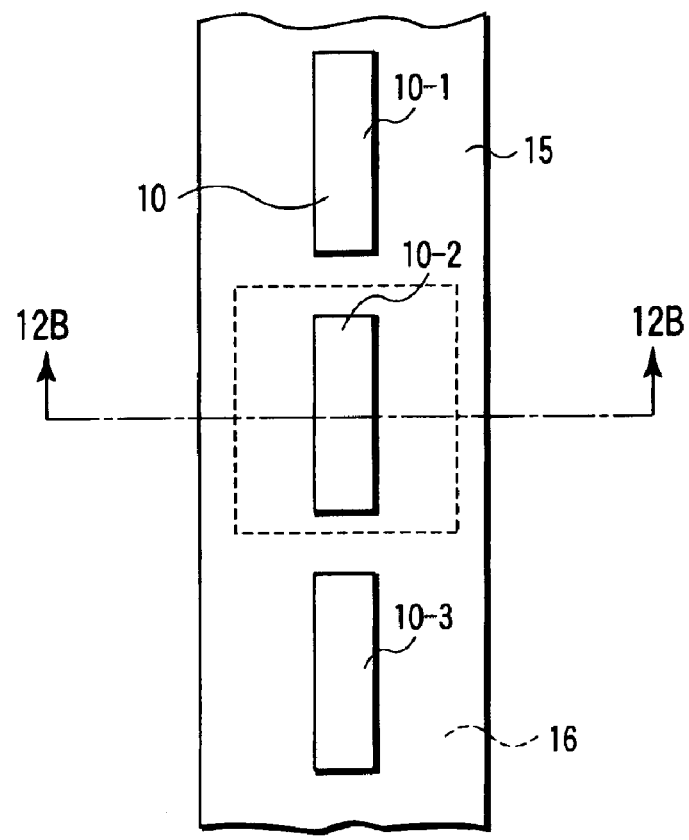
FIG. 12A is a plan view of a magnetic memory device according to a twelfth embodiment of this invention.
Figure 12B:
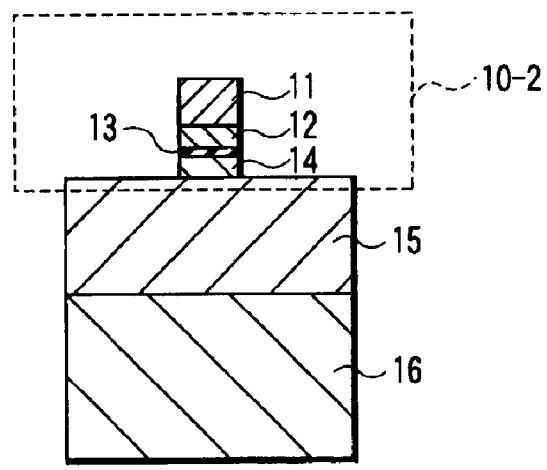
FIG. 12B is a cross sectional view of the twelfth embodiment taken along the 12B—12B line of FIG. 12A as viewed in a direction indicated by the arrows thereof.

FIG. 12A is a plan view of a magnetic memory device according to a twelfth embodiment of this invention. FIG. 12B is a cross sectional view of the magnetic memory device taken along the 12B—12B line of FIG. 12A as viewed in a direction indicated by the arrows thereof. Next, the structure of the present embodiment is explained in detail with reference to FIGS. 12A and 12B.

FIG. 12A shows a plurality of MTJ elements 10-1 to 10-3 arranged in the wiring lengthwise direction of a first programming wiring 16 and a SAL layer 15 formed to overlap the first programming wiring 16 and having magnetic interaction with respect to the MTJ elements 10-1 to 10-3. The SAL (Soft Adjacent Layer) layer 15 is a ferromagnetic layer containing a soft magnetic body.

Further, second programming wirings which are used to configure the magnetic memory device, respectively arranged above the MTJ elements 10-1 to 10-3 and disposed substantially perpendicular to the first programming wiring 16 are omitted.

As shown in FIG. 12A, the present embodiment is featured in that the MTJ elements 10-1 to 10-3 are arranged so that the short-length direction of the MTJ elements 10-1 to 10-3 will be set in substantially the same direction as the lengthwise direction of the first programming wiring 16 and SAL layer 15.

Next, the same reference symbols are attached to those portions which are similar to the corresponding portions of the first embodiment, the explanation thereof is omitted and the configuration which is different from that of the first embodiment is explained below.

The MTJ element 10 is explained by taking the MTJ element 10-2 as an example. For example, as shown in FIG. 12B, the MTJ element 10-2 has a structure in which an anti-ferromagnetic film 11 used to fix the spin direction of a pin layer 12, a ferromagnetic pin layer 12 whose spin direction is fixed by the anti-ferromagnetic film 11, a tunnel barrier layer 13 and a ferromagnetic free layer 14 whose spin direction is changed by a magnetic field generated by the first programming wiring 16 and second programming wiring (not shown) are laminated in this order. The other MTJ elements 10-1, 10-3 have the same structure.

As shown in FIG. 12B, the SAL layer 15 is inserted between the MTJ element 10-2 and the first programming wiring 16 and magnetic interaction is caused between the SAL layer 15 and the free layer 14 of the MTJ element 10-2.

Next, the programming and readout operations of the present embodiment are explained in detail with reference to FIGS. 13A, 13B, 14A and 14B.

Figure 13A:
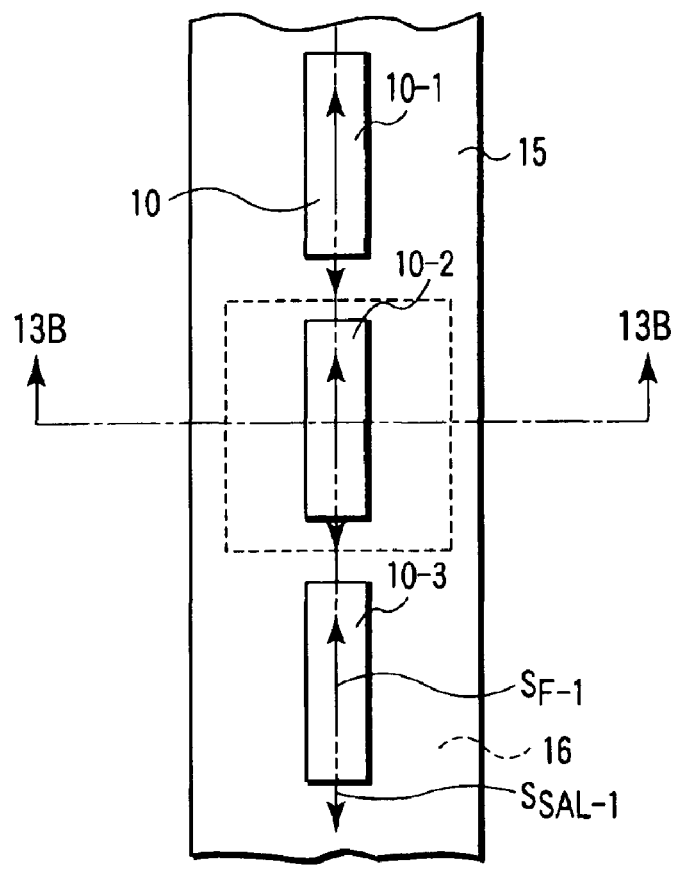
FIG. 13A is a plan view schematically showing the spin states of free layers 14 and SAL layer 15 before passing a current through the first programming wiring 16 according to the twelfth embodiment.
Figure 13B:
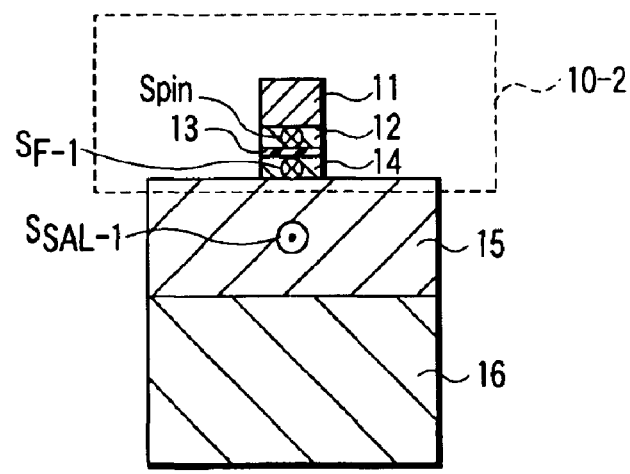
FIG. 13B is a cross sectional view of the twelfth embodiment taken along the 13B—13B line of FIG. 13A as viewed in a direction indicated by the arrows thereof.
Figure 14A:
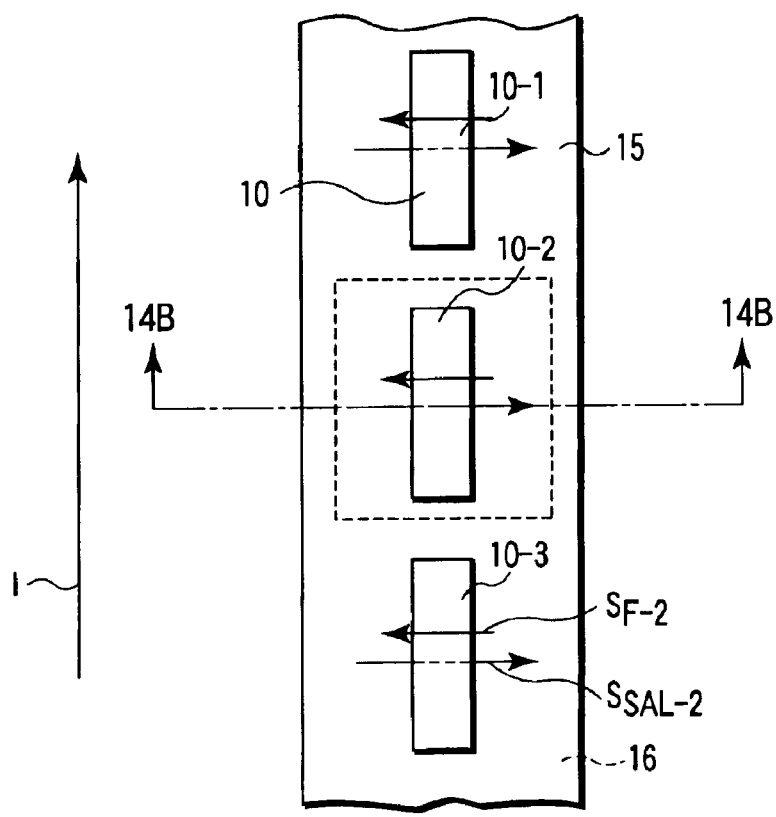
FIG. 14A is a plan view schematically showing the spin states of free layers and SAL layer and the direction of a current while a current is being caused to flow through the first programming wiring 16 according to the twelfth embodiment.
Figure 14B:
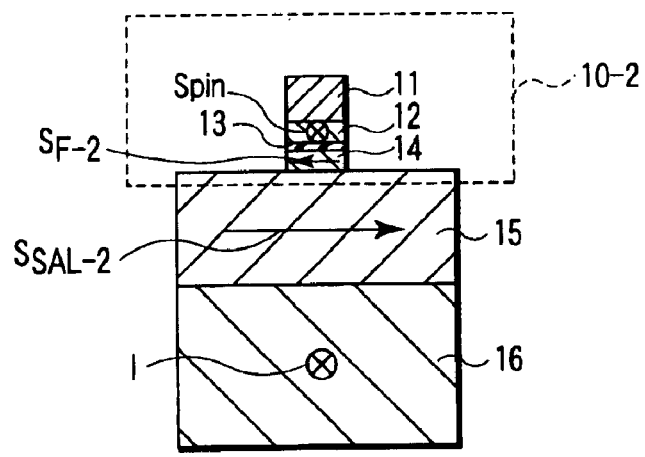
FIG. 14B is a cross sectional view of the twelfth embodiment taken along the 14B—14B line of FIG. 14A as viewed in a direction indicated by the arrows thereof.

FIGS. 13A and 13B show the spin states of the MTJ elements 10-1 to 10-3 and SAL layer 15 before passing a current through the first programming wiring 16. FIGS. 14A and 14B show the spin states of the MTJ elements 10-1 to 10-3 and SAL layer 15 while a current is being caused to flow through the first programming wiring 16.

First, the spin states of the respective layers before passing a current through the first programming wiring 16 are explained with reference to FIGS. 13A, 13B. FIG. 13A is a plan view schematically showing the spin directions by use of arrows in the magnetic memory device according to the present embodiment shown in FIG. 12A. FIG. 13B is a cross sectional view of the twelfth embodiment taken along the 13B—13B line of FIG. 13A as viewed in a direction indicated by the arrows thereof.

As shown in FIG. 13A, the direction of the spin $S_{SAL-1}$ of the SAL layer 15 is set in the lengthwise direction of the SAL layer 15 before passing a current through the first programming wiring 16. Likewise, the direction of the spin $S_{F-1}$ of the free layer 14 of each of the MTJ elements 10-1 to 10-3 is set in the lengthwise direction of the MTJ elements 10-1 to 10-3 before passing the current.

Also, in FIG. 13B, the state in which the spin $S_{SAL-1}$ of the SAL layer 15 and the spin $S_{F-1}$ of the free layer 14 are set in the lengthwise directions of the respective layers before passing a current through the first programming wiring 16 is shown. The present embodiment is featured in that magnetic interaction causing ferromagnetic coupling which makes the direction of the spin $S_{SAL-1}$ of the SAL layer 15 bilinear with respect to the direction of the spin $S_{F-1}$ of the free layer 14 occurs.

Since the direction of the spin $S_{PIN}$ of the pin layer 12 is fixed by the action of the anti-ferromagnetic film 11, the direction of the spin $S_{PIN}$ is kept unchanged before and after passing a current through the first programming wiring 16. In this example, the state in which the direction of the spin $S_{PIN}$ is set parallel to the direction of the spin $S_{F-1}$ of the free layer 14 is shown in FIG. 13B.

Now, the readout operation is explained in detail by taking the MTJ element 10-2 as an example.

Generally, when information of the MTJ element is read out, a variation in the resistance of the MTJ element 10 is detected. That is, when the directions of the spins of the pin layer and free layer are set parallel to each other, the specific resistance of the MTJ element becomes minimum and the state thereof is set to a "1" state, for example. Likewise, when the directions of the spins of the pin layer and free layer are set bilinear, the specific resistance of the MTJ element becomes maximum and the state thereof is set to a "0" state, for example. Therefore, information of the MTJ element 10-2 shown in FIG. 13B is read out as the "1" state, for example.

More specifically, the readout operation is performed by sequentially passing a current through the SAL layer 15, free layer 14, tunnel barrier layer 13, pin layer 12, anti-ferromagnetic layer 11 starting from the first programming wiring and detecting the resistance of the MTJ element by use of a sense amplifier (not shown) connected in series. Therefore, in the case of FIG. 13B, the specific resistance of the MTJ element 10-2 (the specific resistance between the anti-ferromagnetic layer 11 and the free layer 14) becomes minimum and information thereof is read out as the "1" state by the sense amplifier, for example. The same operation as the above operation is performed in the other MTJ elements 10-1, 10-3.

Further, the programming operation while a current is passed in the direction of an arrow I through the first programming wiring 16 is explained by use of FIGS. 14A and 14B. FIG. 14A is a plan view schematically showing the spin directions by use of arrows in the magnetic memory device according to the present embodiment shown in FIG. 12A. FIG. 14B is a cross sectional view schematically showing the spin directions by use of arrows in the magnetic memory device taken along the 14B—14B line of FIG. 14A as viewed in a direction indicated by the arrows thereof. The programming operation is explained in detail below by taking the MTJ element 10-2 as an example.

As shown in FIGS. 14A and 14B, when a current is caused to flow in the direction of the arrow I through the first programming wiring 16, a magnetic field is generated from the first programming wiring 16 according to the so-called corkscrew rule. Then, substantially all of the magnetic field generated from the wiring 16 is applied to the SAL layer 15 and almost no magnetic field is applied to the MTJ element 10-2 since the SAL layer 15 is formed of a soft magnetic body having sufficiently high magnetic permeability (for example, the magnetic permeability is 1000 or more). Therefore, a large part of the magnetic flux generated from the wiring 16 passes through the SAL layer 15 and the direction of the spin $S_{SAL-2}$ of the SAL layer 15 is set in the short-length direction of the SAL layer 15.

In this example, the magnetic interaction having the ferromagnetic coupling which sets the direction of the spin $S_{SAL-1}$ of the SAL layer 15 bilinear with respect to the direction of the spin $S_{F-1}$ of the free layer 14 occurs before passing a current through the first programming wiring 16. The ferromagnetic coupling is maintained before and after the current is passed through the first programming wiring 16 and acts on the spin $S_{F-1}$ of the free layer 14 to maintain the bilinear relation.

That is, as shown in FIGS. 14A and 14B, if the direction of the spin $S_{SAL-2}$ of the SAL layer 15 is set in the short-length direction of the SAL layer 15, the direction of the spin $S_{F-2}$ of the free layer 14 tends to keep the bilinear relation with respect to the direction of the spin $S_{SAL-2}$ because of the presence of ferromagnetic coupling between the SAL layer 15 and the free layer 14. As a result, the direction of the spin $S_{F-2}$ of the free layer 14 is set in the short-length direction of the MTJ element 10-2. Further, since the direction of the spin $S_{PIN}$ of the pin layer 12 is fixed by the action of the anti-ferromagnetic film 11, the direction of the spin $S_{PIN}$ is kept unchanged while a current is being passed through the first programming wiring 16. Therefore, in the state in which a current is passed through the first programming wiring 16, the spin $S_{F-2}$ of the free layer 14 and the spin $S_{PIN}$ of the pin layer 11 become opposite to each other. The state is shown in FIG. 14B.

The same state is set in the other MTJ elements 10-1, 10-3. That is, the directions of the spins $S_{F-2}$ of the free layers 14 of the MTJ elements 10-1 to 10-3 are all set in the short-length direction of the MTJ elements. 10-1 to 10-3 by the magnetic field caused by the current flowing in the first programming wiring 16. That is, the directions of the spins of the free layers 14 of the MTJ elements 10-1 to 10-3 are half-reversed and all of the MTJ elements are set into the half-selected state.

Further, in FIGS. 14A, 14B, second programming wirings which are arranged substantially perpendicular to the first programming wiring 16 and respectively disposed above the MTJ elements 10-1 to 10-3 to configure the magnetic memory device are omitted. Therefore, when the MTJ element 10-2 is completely programmed, a current is caused to flow through the second programming wirings (not shown) to further half-reverse the spin $S_{F-2}$ of the free layer 14 by the magnetic field caused by the current flowing through the second programming wiring. As a result, the direction of the spin $S_{F-2}$ of the free layer 14 and the direction of the spin $S_{PIN}$ of the pin layer 12 are set opposite to each other and the state is changed from the "1" state to the "0" state, for example. As described above, the entire programming operation for the MTJ element 10-2 is completed.

Likewise, the readout operation after the programming operation is performed by sequentially passing a current through the SAL layer 15, free layer 14, tunnel barrier layer 13, pin layer 12, anti-ferromagnetic layer 11 starting from the first programming wiring 16 and detecting the resistance of the MTJ element by use of a sense amplifier (not shown) coupled in series. Therefore, after programming, the specific resistance of the MTJ element 10-2 (the specific resistance between the anti-ferromagnetic layer 11 and the free layer 14) becomes maximum and information thereof is read out as the "0" state by the sense amplifier, for example.

The same operation as the above operation is also performed in the other MTJ elements 10-1, 10-3.

The present embodiment has a feature that the ferromagnetic coupling which holds the bilinear relation between the SAL layer 15 and the free layers 14 is utilized. Therefore, the same effect as that of the first embodiment can be attained based on the above-described operation.

However, as shown in FIG. 12A, the MTJ elements 10-1 to 10-3 are so arranged that the lengthwise direction of the MTJ elements 10-1 to 10-3 are set substantially in the same direction as the lengthwise direction of the first programming wiring 16. By forming the layout as in the present embodiment, the dimension of the first programming wiring 16 in the short-length direction can be made smaller and the layout area in this direction can be reduced.

The present embodiment has the layout in which only the MTJ elements 10 are turned by 90° in comparison with the first embodiment shown in FIGS. 1A, 1B. Therefore, like the former embodiments, various modifications can be considered by combining the cross sectional structures and plane structures of the SAL layers 15. That is, the second to sixth plane structures shown in FIGS. 4 to 8 are considered as the plane structure. Further, as the cross sectional structure, the structure of FIG. 10 showing the cross sectional structure which includes the interlaid film 25 and the structure of FIG. 11 showing the cross sectional structure which includes the interlaid film 26 in addition to the second to fourth cross sectional structures shown in FIGS. 9A to 9C are considered.

Therefore, if all modifications are taken into consideration and the modifications obtained by combinations of the plane structures and cross sectional structures are each expressed by use of (cross sectional structure, plane structure), the following modifications of the embodiments can be considered, for example. That is, twenty modifications of (FIG. 12B, FIGS. 4 to 8), (FIG. 12B+FIG. 9A, FIGS. 4 to 8), (FIG. 12B+FIG. 9B, FIGS. 4 to 8), (FIG. 12B+FIG. 9C, FIGS. 4 to 8) can be considered. For example, the cross sectional structure expressed by (FIG. 12B+FIG. 9A) indicates a modification having the cross sectional structure of the SAL layer 15 shown in FIG. 9A used in the layout shown in FIG. 12B. The cross sectional structures expressed by (FIG. 12B+FIG. 9B), (FIG. 12B+FIG. 9C) indicate the same type of cross sectional structures as described above.

Further, forty modifications of (FIG. 12B+FIG. 10, FIGS. 4 to 8), (FIG. 12B+FIG. 9A+FIG. 10, FIGS. 4 to 8), (FIG. 12B+FIG. 9B+FIG. 10, FIGS. 4 to 8), (FIG. 12B+FIG. 9C+FIG. 10, FIGS. 4 to 8) and (FIG. 12B+FIG. 11, FIGS. 4 to 8), (FIG. 12B+FIG. 9A +FIG. 11, FIGS. 4 to 8), (FIG. 12B+FIG. 9B+FIG. 11, FIGS. 4 to 8), (FIG. 12B+FIG. 9C+FIG. 11, FIGS. 4 to 8) can be considered. For example, the cross sectional structure expressed by (FIG. 12B+FIG. 10) indicates a modification in which the cross sectional structure having the interlaid film 25 shown in FIG. 10 inserted therein is used in the layout shown in FIG. 12B. The cross sectional structure expressed by (FIG. 12B+FIG. 9A+FIG. 10) indicates a modification in which the cross sectional structure of the SAL layer 15 shown in FIG. 9A is used in the above cross sectional structure. The cross sectional structures expressed by (FIG. 12B+FIG. 11), (FIG. 12B+FIG. 9A+FIG. 11) indicate the same type of cross sectional structures as described above. Thus, 60 modifications in total can be considered, for example.

[Thirteenth Embodiment]

Figure 15A:
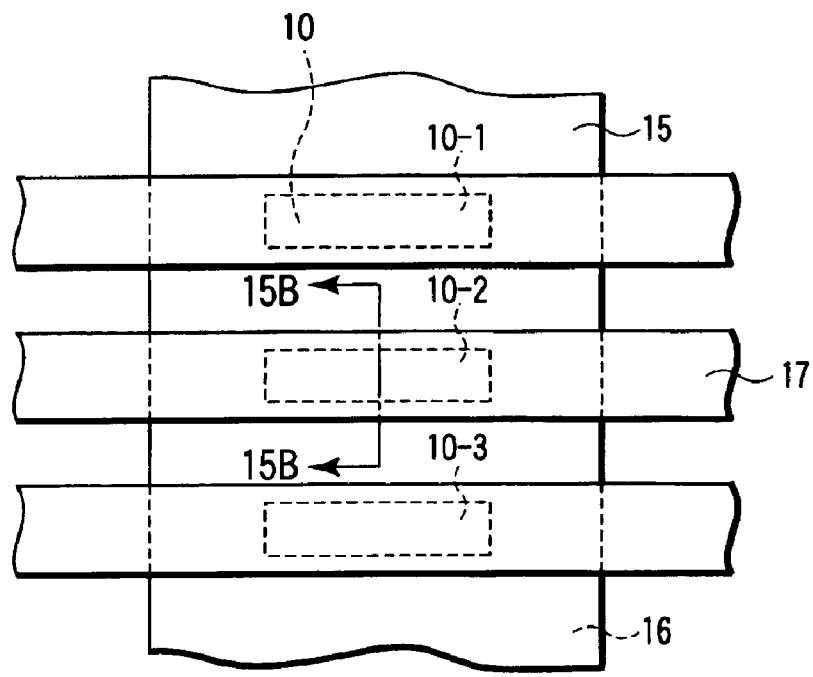
FIG. 15A is a plan view of a magnetic memory device according to a thirteenth embodiment of this invention.
Figure 15B:
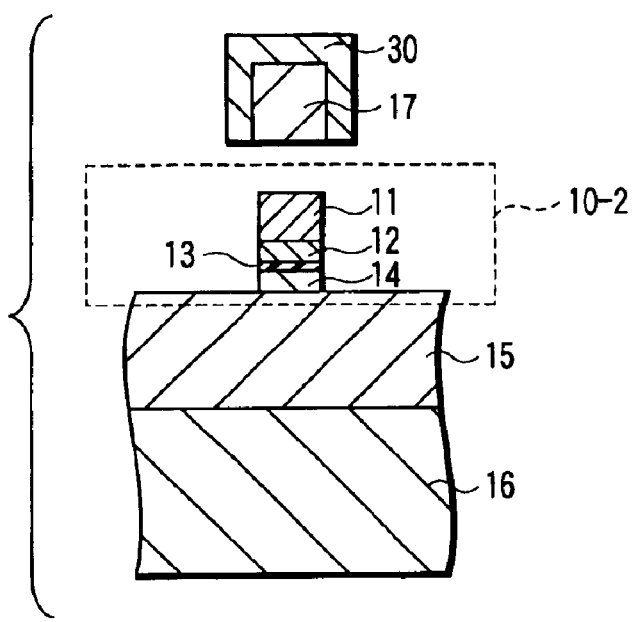
FIG. 15B is a cross sectional view of the thirteenth embodiment taken along the 15B—15B line of FIG. 15A as viewed in a direction indicated by the arrows thereof.

FIG. 15A is a plan view schematically showing a magnetic memory device according to a thirteenth embodiment of this invention. FIG. 15B is a cross sectional view of the thirteenth embodiment taken along the 15B—15B line of FIG. 15A as viewed in a direction indicated by the arrows thereof. Next, the structure of the present embodiment is explained in detail with reference to FIGS. 15A and 15B. Further, only portions of the thirteenth embodiment which are different from those of the first embodiment are explained.

FIG. 15A shows second programming wirings 17 which are not shown in FIG. 1A and are formed to be substantially perpendicular to a first programming wiring 16 on respective MTJ elements 10-1 to 10-3. The present embodiment shows an example in which yoke portions 30 are formed on the respective second programming wirings 17.

As shown in FIG. 15B, the yoke portion 30 is formed to cover the upper surface and both side surfaces of the second programming wiring 17. The yoke portion 30 is formed of a ferromagnetic body containing a soft magnetic material such as NiFe having high magnetic permeability.

The programming and readout operations are the same as those of the first embodiment and the explanation thereof is omitted.

A programming current caused to flow in the second programming wiring 17 can be reduced by forming the yoke portion 30 on the second programming wiring 17. Specifically, if the yoke portion 30 is formed, the effect of efficiency which is enhanced by approximately two times (the programming current which is reduced by approximately half) can be attained.

This is because the yoke portion 30 is formed to contain a soft magnetic material having high magnetic permeability. If the yoke portion 30 is formed to contain the soft magnetic material, almost all of the magnetic fluxes generated from the upper surface and both side surfaces of the second programming wiring 17 among the magnetic fluxes generated from the second programming wiring 17 at the programming time are conducted through the yoke 30. Therefore, the generated magnetic fluxes can be prevented from spreading in all directions of the array and interfering with one another and erroneous programming can be prevented. For example, it can be prevented that the magnetic flux generated from the second programming wiring 17 above the MTJ element 10-2 gives an influence to the free layer 14 of the adjacent MTJ element 10-1 or 10-3 to erroneously perform the programming operation. The interference between the magnetic fluxes becomes more significant in the larger-scale array for the same reason described in the first embodiment. However, in the present embodiment, even in the large-scale array, the interference between the magnetic fluxes generated from the second programming wirings 17 can be prevented and the erroneous programming operation can be prevented with a higher probability.

On the other hand, since the yoke portion is not formed on the undersurface of the second programming wiring 17, substantially the entire portion of the magnetic flux generated from the second programming wiring 17 can be applied to the free layer 14 of the MTJ element 10 via the undersurface thereof. Therefore, the programming current which is passed through the second programming wiring 17 can be reduced.

Like the first embodiment, a SAL layer 15 is formed on the first programming wiring 16. Therefore, the programming current which is passed through the first programming wiring 16 can also be reduced. Further, interference with the magnetic flux generated from the first programming wiring 16 can be prevented.

As described above, according to the present embodiment, the erroneous programming operation due to the interference between the magnetic fluxes can be considerably prevented and the programming current which is passed through the second programming wiring 17 can be greatly reduced.

The yoke portion 30 can be formed to cover only the upper surface of the second programming wiring 17 or only the both side surfaces of the second programming wiring 17. With this structure, since a step of forming the yoke portion 30 on the upper surface or both side surfaces of the second programming wiring 17 can be omitted, the number of manufacturing steps can be reduced.

Further, the yoke portion 30 can be formed of a substance having the physical property of a soft magnetic material instead of the soft magnetic alloy having a high content of Ni.

That is, the yoke portion 30 can be formed by the same manufacturing method as that for forming the SAL layer by use of the same material as the SAL layer 15. Therefore, it is extremely simple to form the yoke portion 30 in addition to the SAL layer 15, but the considerable effect can be attained by forming the yoke portion as described above. This is a great advantage in the present embodiment.

The structure having the yoke portion 30 formed on the second programming wiring 17 can be adequately combined with the structures explained in the second to twelfth embodiments. If one example of a modification of a combination of the plane structure and cross sectional structure of the SAL layer 15 is expressed by (cross sectional structure, plane structure), a modification of (FIG. 9A, FIG. 5) can be considered, for example.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory device comprising:
   a first conductive layer;
   a second conductive layer formed above the first conductive layer and arranged substantially perpendicular to the first conductive layer;
   a plurality of magneto-resistance effect elements formed between the first and second conductive layers, arranged in the lengthwise direction of the first conductive layer and containing free layers whose spin directions are controlled to be reversed by a resultant magnetic field caused by the first and second conductive layers; and
   a magnetic layer inserted between the first conductive layer and the magneto-resistance effect element, including a soft magnetic body, and causing a magnetic interaction with respect to the free layers of the magneto-resistance effect elements.

2. The magnetic memory device according to claim 1, wherein each of the magneto-resistance effect elements includes a corresponding free layer disposed on the magnetic layer, a tunnel barrier layer disposed on the free layer, a pin layer disposed on the tunnel barrier layer and a fixing layer which is disposed on the pin layer and fixes the spin direction of the pin layer.

3. The magnetic memory device according to claim 2, wherein the fixing layer includes at least an anti-ferromagnetic body.

4. The magnetic memory device according to claim 1, wherein the soft magnetic body includes a soft magnetic alloy containing at least Ni.

5. The magnetic memory device according to claim 1, wherein the magneto-resistance effect elements are arranged with the lengthwise direction thereof being substantially perpendicular to the lengthwise direction of the first conductive layer, the spin of the free layer is set in the lengthwise direction of the magneto-resistance effect element, the spin of the magnetic layer is set in the lengthwise direction of the magnetic layer, and the magnetic interaction which causes the spin of the free layer to be set in the short-length direction of the magneto-resistance effect element and causes the spin of the magnetic layer to be set in the short-length direction of the magnetic layer occurs while a programming current is being passed through the first conductive layer.

6. The magnetic memory device according to claim 1, wherein the magneto-resistance effect elements are arranged with the lengthwise direction thereof being substantially in the same direction as the lengthwise direction of the first conductive layer, the spin of the free layer is set in the lengthwise direction of the magneto-resistance effect element, the spin of the magnetic layer is set in the lengthwise direction of the magnetic layer, and the magnetic interaction which causes the spin of the free layer to be set in the short-length direction of the magneto-resistance effect element and causes the spin of the magnetic layer to be set in the short-length direction of the magnetic layer occurs while a programming current is being passed through the first conductive layer.

7. The magnetic memory device according to claim 5, wherein the magnetic layer has a magnetic property which is substantially uniform over the entire portion thereof.

8. The magnetic memory device according to claim 6, wherein the magnetic layer has a magnetic property which is substantially uniform over the entire portion thereof.

9. The magnetic memory device according to claim 5, wherein the magnetic layer has magnetic resistive portions each of which has a larger resistance than the internal portion of each of the magneto-resistance effect elements and is formed between two preset adjacent magneto-resistance effect elements.

10. The magnetic memory device according to claim 9, wherein each of the magnetic resistive portions includes at least one gap formed between the magneto-resistance effect elements of the magnetic layer.

11. The magnetic memory device according to claim 9, wherein each of the magnetic resistive portions includes at least one gap formed for every preset number of magneto-resistance effect elements of the magnetic layer.

12. The magnetic memory device according to claim 9, wherein each of the magnetic resistive portions includes at least one cut-away portion formed between two preset adjacent magneto-resistance effect elements in at least one of two end portions of the magnetic layer extending in the lengthwise direction thereof.

13. The magnetic memory device according to claim 9, wherein each of the magnetic resistive portions includes at least one projection formed between two preset adjacent magneto-resistance effect elements in at least one of two end portions of the magnetic layer extending in the lengthwise direction thereof.

14. The magnetic memory device according to claim 1, wherein the magnetic layer is formed not only on the surface of the first conductive layer which faces the free layer but also on both side surfaces of the first conductive layer.

15. The magnetic memory device according to claim 1, wherein the magnetic layer is formed to cover the entire surface of the first conductive layer.

16. A magnetic memory device comprising:
a first conductive layer;
a second conductive layer formed above the first conductive layer and arranged substantially perpendicular to the first conductive layer; and
a plurality of magneto-resistance effect elements formed between the first and second conductive layers, arranged in the lengthwise direction of the first conductive layer and containing free layers whose spin directions are controlled to be reversed by a resultant magnetic field caused by the first and second conductive layers;
wherein the first conductive layer is formed of a soft magnetic body which causes a magnetic interaction with respect to the free layers of the magneto-resistance effect elements, and
wherein each of the magneto-resistance effect elements includes a tunnel barrier layer disposed on the free layer, a pin layer disposed on the tunnel barrier layer and a fixing layer which is disposed on the pin layer and fixes the spin direction of the pin layer.

17. The magnetic memory device according to claim 1, further comprising an intermediate layer inserted between the magneto-resistance effect elements and the magnetic layer, the magnetic layer and free layers causing the magnetic interaction to occur via the intermediate layer.

18. The magnetic memory device according to claim 17, wherein the intermediate layer has substantially the same area as the magnetic layer.

19. The magnetic memory device according to claim 17, wherein the intermediate layer contains a non-magnetic conductive body.

20. The magnetic memory device according to claim 17, wherein the intermediate layer contains at least one of Cu, Ru, Au, Cr.

21. The magnetic memory device according to claim 1, further comprising a yoke portion which covers at least one of the upper surface and both side surfaces of the second conductive layer.

22. The magnetic memory device according to claim 21, wherein the yoke portion is formed of the same material as the magnetic layer.

23. The magnetic memory device according to claim 21, wherein the yoke portion contains a soft magnetic body.

24. The magnetic memory device according to claim 21, wherein the soft magnetic body contains a soft magnetic alloy containing at least Ni.

25. The magnetic memory device according to claim 1, wherein an easy axis of the free layer is set substantially perpendicular to an easy axis of the magnetic layer before passing a programming current through the first conductive layer and a hard axis of the free layer is set substantially perpendicular to a hard axis of the magnetic layer after passing the programming current through the first conductive layer.

26. The magnetic memory device according to claim 1, wherein an easy axis of the free layer is set in a direction substantially opposite to an easy axis of the magnetic layer before passing a programming current through the first conductive layer and a hard axis of the free layer is set in a direction substantially opposite to a hard axis of the magnetic layer after passing the programming current through the first conductive layer.

* * * * *